(12) United States Patent
Nakata et al.

(10) Patent No.: US 7,579,222 B2
(45) Date of Patent: Aug. 25, 2009

(54) MANUFACTURING METHOD OF THIN FILM DEVICE SUBSTRATE

(75) Inventors: Mitsuru Nakata, Tokyo (JP); Kazushige Takechi, Tokyo (JP); Hiroshi Kanoh, Tokyo (JP)

(73) Assignee: NEC Corporation, Tokyo (JP)

( * ) Notice: Subject to any disclaimer, the term of this patent is extended or adjusted under 35 U.S.C. 154(b) by 219 days.

(21) Appl. No.: 11/503,286

(22) Filed: Aug. 14, 2006

(65) Prior Publication Data

US 2006/0276007 A1 Dec. 7, 2006

Related U.S. Application Data

(63) Continuation of application No. 10/974,932, filed on Oct. 28, 2004, now Pat. No. 7,122,444.

(30) Foreign Application Priority Data

Oct. 30, 2003 (JP) ............... 2003-370912

(51) Int. Cl.
*H01L 21/00* (2006.01)
(52) U.S. Cl. ............... 438/149; 438/151; 257/E21.102; 257/E21.123; 117/94
(58) Field of Classification Search .......... 257/E21.569, 257/E21.413, E21.102, E21.123; 438/455, 438/149, 151, 158; 117/94
See application file for complete search history.

(56) References Cited

U.S. PATENT DOCUMENTS

| | | | | |
|---|---|---|---|---|
| 5,217,564 | A * | 6/1993 | Bozler et al. ................ | 438/107 |
| 5,328,549 | A * | 7/1994 | Bozler et al. ................ | 438/107 |
| 6,468,879 | B1 * | 10/2002 | Lamure et al. ............... | 438/458 |
| 6,593,211 | B2 * | 7/2003 | Sato ........................... | 438/455 |
| 6,597,039 | B2 * | 7/2003 | Ohmi et al. .................. | 257/347 |
| 6,613,678 | B1 * | 9/2003 | Sakaguchi et al. .......... | 438/695 |
| 6,656,271 | B2 * | 12/2003 | Yonehara et al. ............ | 117/94 |
| 7,163,739 | B2 * | 1/2007 | Koike et al. ................. | 428/343 |
| 7,288,484 | B1 * | 10/2007 | Goto et al. .................. | 438/710 |
| 2001/0003668 | A1 * | 6/2001 | Yanagita et al. ............. | 438/455 |
| 2001/0040645 | A1 * | 11/2001 | Yamazaki .................... | 349/42 |
| 2002/0045327 | A1 * | 4/2002 | Yanagita et al. ............. | 438/459 |

(Continued)

FOREIGN PATENT DOCUMENTS

JP 8-288522 11/1996

(Continued)

*Primary Examiner*—Fernando L Toledo
(74) *Attorney, Agent, or Firm*—Young & Thompson

(57) ABSTRACT

Method of manufacturing a thin film device substrate wherein no trench fabrication is required to be applied onto the substrate surface, and a material which is impervious to light can be used, and the substrate can be peeled off quickly. Firstly, a peeling-off film, a silicon oxide film and an amorphous silicon film are formed in succession on a glass substrate, and the amorphous silicon film is irradiated from above to obtain a polycrystalline silicon film. Subsequently, using the polycrystalline silicon film as an active layer, a TFT is formed, and then a plastic substrate is bonded thereon, and finally the glass substrate is peeled off with the peeling-off film, to complete transfer of the TFT. Because the peeling-off film has a gap space, its etching rate is high. Therefore, it is unnecessary to form a trench for supplying an etchant on the surface of the glass substrate.

2 Claims, 27 Drawing Sheets

U.S. PATENT DOCUMENTS

| | | | |
|---|---|---|---|
| 2002/0127820 A1* | 9/2002 | Sato | 438/458 |
| 2004/0055894 A1* | 3/2004 | Iwasaki et al. | 205/157 |
| 2004/0082146 A1* | 4/2004 | Ohmi et al. | 438/455 |

FOREIGN PATENT DOCUMENTS

| | | |
|---|---|---|
| JP | 10-125931 | 5/1998 |
| JP | 11-26733 | 1/1999 |
| JP | 11-97357 | 4/1999 |
| JP | 11-212116 | 8/1999 |
| JP | 11-243209 | 9/1999 |
| JP | 11-312811 | 11/1999 |
| JP | 2000-91604 | 3/2000 |
| JP | 2002-184959 | 6/2002 |

* cited by examiner

[1]

[2]

[3]

[1]

[2]

[1]

[2]

[3]

[1]

[2]

[3]

[1]

(A)  (B)

[2]

[1]

[2]

(A)　　　　　　　　　　　　　(B)

[1]

[2]

[1]

[2]

[1]

[2]

[1]

[2]

[1]

[2]

[1]

[2]

[1]

[2]

[1]

[2]

[3]

[4]

[1]

[2]

MANUFACTURING METHOD OF THIN FILM DEVICE SUBSTRATE

BACKGROUND OF THE INVENTION

1. Field of the Invention

The present invention relates to a manufacturing method of a thin film device substrate which comprising the step of transferring a thin film device formed on one substrate onto another substrate.

2. Description of the Related Art

For the switching element in the pixel section of the liquid crystal display unit, the thin film transistor (referred to as the "TFT" hereinafter) has been being widely used. In recent years, with the object of achieving the liquid crystal display unit of higher precision as well as producing the system on glass (referred to as the "SOG" hereinafter) successfully, there have been growing demands for higher operation speeds. The SOG herein is a technique to integrate, along with the TFT for driving the liquid crystal, the TFTs in adjacent circuits such as the driver circuit, the memory and the CPU (Central Processing Unit) onto one glass substrate.

When, for example, the liquid crystal display device making use of the TFT is fabricated, the glass substrate is generally utilized. The glass substrate is, however, not necessarily the best material. The glass substrate is disadvantageously heavy, fragile and inflexible. As against this, as the substrate which is lighter, less fragile and more flexible, there can be given the plastic substrate. Nevertheless, the TFT formed on the plastic substrate has the disadvantage of poorer performance than that of the TFT formed on the glass substrate, since the processing temperature for the TFT formed on the plastic substrate is limited to 150° C. or so. Accordingly, there have been brought forward several methods wherein, after a plastic substrate is bonded onto a TFT formed on a glass substrate, the glass substrate is peeled off therefrom and thereby the TFT is transferred onto the plastic substrate. They are further described below.

In a method disclosed in Japanese Patent Application Laid-open No. 288522/1996, by forming numerous trenches in a glass substrate and then forming a silicon oxide film on the glass substrate by means of spin-coat, formation of gaps in the trenches is made, and following the TFT formation, an etching solution is permeated into these gaps, and thereby the glass substrate is peeled off. In a method disclosed in Japanese Patent Application Laid-open No. 26733/1999, an isolation layer made of amorphous silicon or the like is laid on a glass substrate that can transmit a laser light, and thereon a TFT is formed. After another substrate is adhered onto this TFT, backside irradiation with the laser light is applied thereto, whereby the bonding force of the isolation layer is weakened so as to separate the glass substrate therefrom. In a method disclosed in Japanese Patent Application Laid-open No. 212116/1999, a glass substrate is characteristically removed by chemical polishing.

In the conventional techniques, however, the following problems are known. In the method of Japanese Patent Application Laid-open No. 288522/1996, the step of forming trenches in a glass substrate is comprised so that the glass substrate surface becomes rough, which lowers the pattern accuracy of the thin film device formed on the glass substrate. In the method of Japanese Patent Application Laid-open No. 26733/1999, because the peeling-off is made with a laser, a material such as a glass having a low transmittance for the laser light or a silicon impervious to laser light cannot be employed for the substrate. In the method of Japanese Patent Application Laid-open No. 212116/1999, the use of the polishing method lengthens its processing tome period.

Accordingly, an object of the present invention is to provide a method of manufacturing a thin film device substrate wherein trench fabrication is not required on the substrate surface, wherein a material which is impervious to light can be used, and wherein the substrate can be peeled off in a short period of time.

SUMMARY OF THE INVENTION

A method of manufacturing a thin film device substrate (referred to as a "manufacturing method" hereinafter) comprises the steps of forming, on a first substrate, a peeling-off film made of a porous film (i.e., a gap space); forming a semiconductor film on said peeling-off film; forming a thin film device with said semiconductor film; bonding a second substrate onto said thin film device; and peeling off said first substrate at said peeling-off film.

A "thin film device substrate" as used herein is a substrate in which a thin film device is formed. One or more layers of other films can be inserted between the first substrate and the peeling-off film, between the peeling-off film and the semiconductor film and between the semiconductor film and the second substrate, respectively.

On the first substrate, a peeling-off film is formed, and on the peeling-off film a semiconductor film is formed, and, then, with this semiconductor film, a thin film device is formed. The second substrate is subsequently bonded onto the thin film device and the first substrate and the peeling-off film are peeled off from this layered structure. Compared with the film having no gap space, the film having the gap space has characteristically greater etching rates, with the gap space facilitating the etchant to penetrate thereinto, and fragile nature to allow easy break. Therefore, the substrate can be easily peeled off therefrom by etching, breaking or such. In other words, the laser light is not required to peel off the substrate so that even a glass with a low transmittance for the laser light, a silicon impervious to laser light or such can be used as a substrate. Further, because polishing is not used for the peeling-off of the substrate herein, the time period necessary to peel off the substrate can be reduced. Moreover, as the etchant penetrates through the gap space, even formation of the trenches on the surface of the first substrate is unnecessary to make the etchant penetrate. Accordingly, trench fabrication of the first substrate surface is unneeded and the thin film device on the first substrate may have excellent pattern accuracy.

In the above-described manufacturing method comprises the steps of forming, on a first substrate, a peeling-off film made of a film having a gap space; forming a semiconductor film on said peeling-off film; bonding a second substrate onto said semiconductor film; peeling off said first substrate and said peeling-off film from a layered structure between said first substrate and said second substrate inclusive; and forming a thin film device with said semiconductor film after peeling off said first substrate and said peeling-off film.

In the above-described manufacturing method, wherein said gap space is formed by means of etching. Etching can easily provide a comparatively large gap space.

In the above-described manufacturing method, wherein the step of forming a peeling-off film on a first substrate comprises the steps of forming, on said first substrate, a primary film in which said gap space is to be formed in a subsequent step; forming, in a film formed on said primary film, a large number of through holes to reach said primary film; and supplying a etchant from said through holes and thereby forming said gap space in said primary film. The "etchant" as used herein is a generic name for etching solutions, etching gases and the likes. On the first substrate, a primary film is formed and then on the primary film, a semiconductor film, for example, is formed. Next, in the semiconductor film, a large number of through holes are formed so as to reach the primary film. Being supplied from these through holes, an etchant etches the primary film isotropically, whereby gap spaces are formed even under the semiconductor film. In this way, the primary film is made a peeling-off film.

In the above-described manufacturing method, wherein the step of peeling off said first substrate and said peeling-off film comprises the step of supplying said etchant into said gap space and thereby removing said peeling-off film. The peeling-off film is removed after the second substrate is bonded onto the thin film device. The removal of the peeling-off film hereat is made by supplying the etchant into the gap space which has been formed in the preceding step. Because numerous gap spaces have been already formed in this peeling-off film, the surface area of the peeling-off film which comes into contact with the etchant has become considerably large so that the peeling-off film can be readily removed.

In the above-described manufacturing method, wherein the step of peeling off said first substrate and said peeling-off film comprises the step of breaking said peeling-off film mechanically. Available breaking methods include a method wherein a wedge-like thing is driven into the peeling-off film to peel off the first substrate and the peeling-off film from the layered structure, and a method wherein the first substrate and the second substrate are made rotate in opposite directions with the peeling-off film being taken as the surface of revolution. Further, after only part of the peeling-off film is etched, the peeling-off film left by that etching can be removed by means of breaking. It is also possible to break part of the peeling-off film first and etch away the rest of the peeling-off film.

In the above-described manufacturing method, wherein said peeling-off film is made of silicon oxide. Silicon oxide can be easily made porous by the spin coating method or the anodization method. Moreover, with excellent heat resistance, silicon oxide can readily stand laser annealing.

In the above-described manufacturing method, which further comprises, with said peeling-off film being taken as a first peeling-off film, the step of forming, over said first peeling-off film, a second peeling-off film that is to be peeled off in a subsequent step; wherein the step of peeling off said first substrate and said first peeling-off film comprises the step of removing said second peeling-off film. One or more layers of other films can be inserted between the first peeling-off film and the second peeling-off film. A second peeling-off film is formed over the first peeling-off film beforehand, and after a second substrate is bonded onto the thin film device, this second peeling-off film is removed. Together with the second peeling-off film, the first substrate and the first peeling-off film are hereupon removed.

In the above-described manufacturing method, which further comprises, with said peeling-off film being taken as a first peeling-off film, the step of forming, under said first peeling-off film, a second peeling-off film that is to be peeled off in a subsequent step; wherein the step of peeling off said first substrate and said first peeling-off film comprises the step of removing said second peeling-off film and removing said first peeling-off film. One or more layers of other films can be inserted between the second peeling-off film and the first peeling-off film. A second peeling-off film is formed under the first peeling-off film beforehand, and after a second substrate is bonded onto the thin film device, this second peeling-off film is removed. Together with the second peeling-off film, the first substrate is hereupon removed. The remaining first peeling-off film is removed separately. Further, the step of removing the second peeling-off film and the step of removing the first peeling-off film can be made one and the same step so that the first peeling-off film and the second peeling-off film may be removed simultaneously.

In the above-described manufacturing method, wherein the step of removing said second peeling-off film comprises the step of making an etchant permeate through said gap space of said first peeling-off film and thereby etching said second peeling-off film. The etchant permeates rapidly through the gap spaces of the first peeling-off film and removes the second peeling-off film lying over or under the first peeling-off film. This shortens the period of time necessary to remove the first substrate.

In the above-described manufacturing method, wherein said second peeling-off film is made of chromium and said first peeling-off film is made of porous silicon oxide. As chromium and silicon oxide excels in heat resistance, they can readily stand laser annealing. Furthermore, chromium etchant permeates rapidly through minute gap spaces of porous silicon oxide and removes the chromium film lying over or under the porous silicon oxide film. This shortens the period of time necessary to remove the first substrate.

In the above-described manufacturing method, wherein the step of peeling off said first substrate and said first peeling-off film comprises the step of breaking mechanically, at least, one of said first peeling-off film and said second peeling-off film. As for the actual breaking method, the aforementioned methods also apply hereto.

In the above-described manufacturing method, wherein the step of peeling off said first substrate and said first peeling-off film comprises the step of dividing said layered structure into a plural number prior to said peeling-off. When peeling-off is chemically made with an etchant or such, the time period required for peeling off depends on the time for the etchant to penetrate, seen from above, from the periphery of the layered structure to the vicinity of its center. Further, when peeling-off is mechanically made with breaking or such, the time period required for peeling off depends on the time for a crack to develop, seen from above, from the periphery of the layered structure to the vicinity of its center. Consequently, division of the layered structure into a plural number reduces the length of the time required for the peeling-off, since the distance from the periphery to the center in each divided layered structure clearly becomes shorter. Meanwhile, breaking can be carried out, for example, by a method in which a wedge is driven into a gap space. There can be also utilized a combined method of these breaking methods, for instance, peeling-off is partly carried out by etching and then completed thoroughly by breaking.

In the above-described manufacturing method, wherein said semiconductor film is made of silicon. Silicon is a semiconductor particularly well suited for various thin film devices such as TFTs, photosensors and solar cells.

In the above-described manufacturing method, wherein said thin film device is a TFT. The semiconductor film is formed into a polycrystalline film of large grain size, which enables the TFT to operate at high speed.

In short, in the present invention, after a structure with a gap space, for instance, a porous silicon oxide film is formed on a substrate and a TFT is formed on that substrate and another substrate is bonded onto that substrate, the structure with a gap space or an overlying layer or an underlying layer of that structure with a gap space is peeled off either by making an etchant penetrate thereto or by breaking mechanically. This arrangement can solve the aforementioned problems of conventional techniques.

In a manufacturing method according to the present invention, after a peeling-off film having a gap space is formed on a first substrate, and a semiconductor film is formed on the peeling-off film, and then a thin film device is formed with this semiconductor film as required, and a second substrate is bonded onto the semiconductor film, the first substrate and the peeling-off film are peeled off from a layered structure of these films, whereby the substrate can be readily peeled off by etching, breaking or such. This results from advantages the film having the gap space has, namely, high etching rates and easily breakable quality. Without requiring the laser light to peel off the substrate, even a glass with a low transmittance for the laser light, a silicon impervious to laser light or such can be used as a substrate. Further, because polishing is not used for the peeling-off of the substrate herein, the time period necessary to peel off the substrate can be reduced. Moreover, as the etchant penetrates through the gap space, trench fabrication of the first substrate surface is unneeded, which improves pattern accuracy of the thin film device on the first substrate.

Further, when, on a substrate, a primary film is formed and, on the primary film, for example, a semiconductor film is formed and, then, in the semiconductor film, a large number of through holes are formed so as to reach the primary film, and an etchant is supplied from these through holes, whereby a great number of gap spaces can be formed within a short period of time, since etching herein proceeds concurrently, starting from these numerous through holes. In this case, if an etchant is supplied for a gap space to remove the peeling-off film in the step of peeling off a first substrate, the surface area of the peeling-off film which comes into contact with the etchant is so large that the first substrate and the peeling-off film can be peeled off with great ease.

Further, when a second peeling-off film is formed over or under the first peeling-off film, and peeling-off of the first substrate is made by removing this second peeling-off film, accomplishment of rapid penetration of the etchant through the gap spaces in the first peeling-off film can shorten the period of time necessary to remove the second peeling-off film.

Further, if the layered structure between the first substrate and the second substrate is divided into a plural number before the first substrate is peeled off, the distance from the periphery to the center, seen from above, in each divided layered structure becomes shorter so that the time period necessary to peel off can be reduced.

DETAILED DESCRIPTION OF THE INVENTION AND PREFERRED EMBODIMENTS

Figure 1:
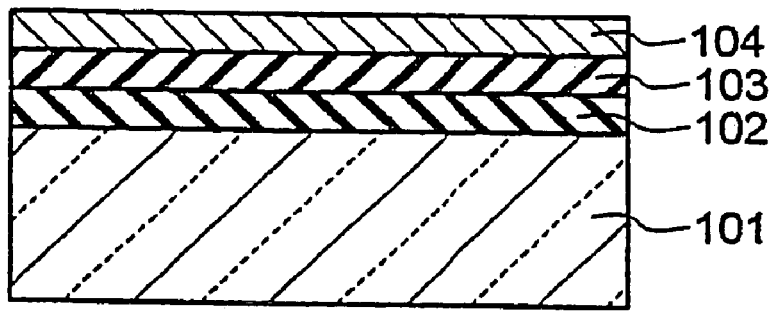
FIG. 1 is a series of schematic cross-sectional views (the first part) illustrating one embodiment of the present invention and the steps of a manufacturing method thereof proceed in the order of FIG. 1(1) to FIG. 1(3).
Figure 1:
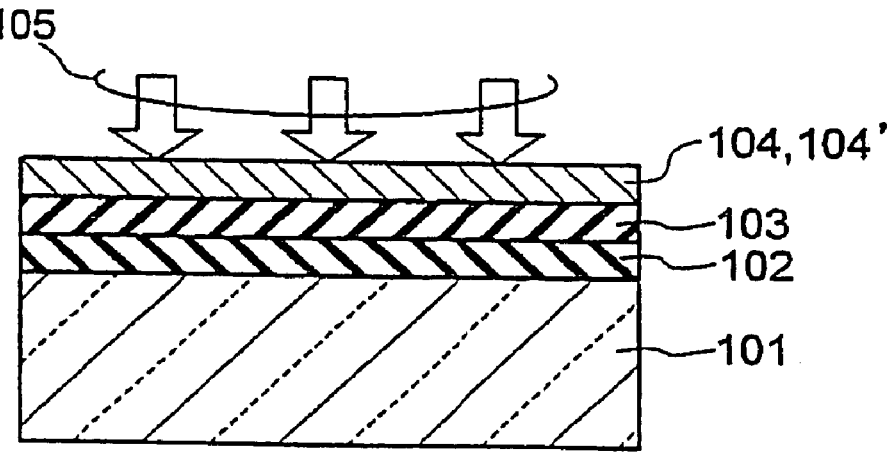
Figure 1:
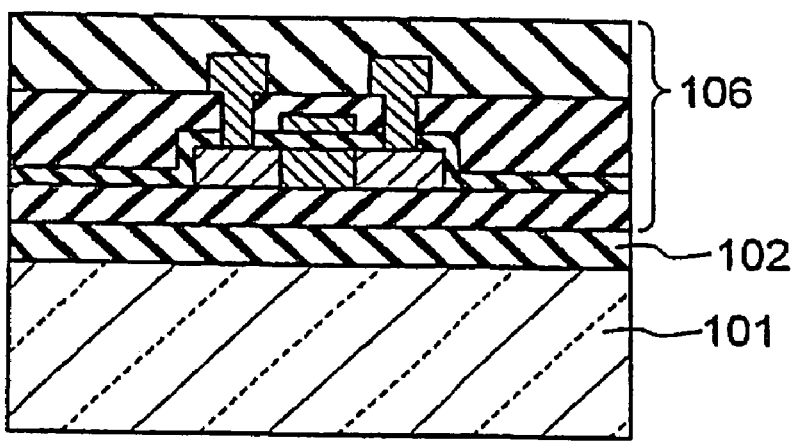
Figure 2:
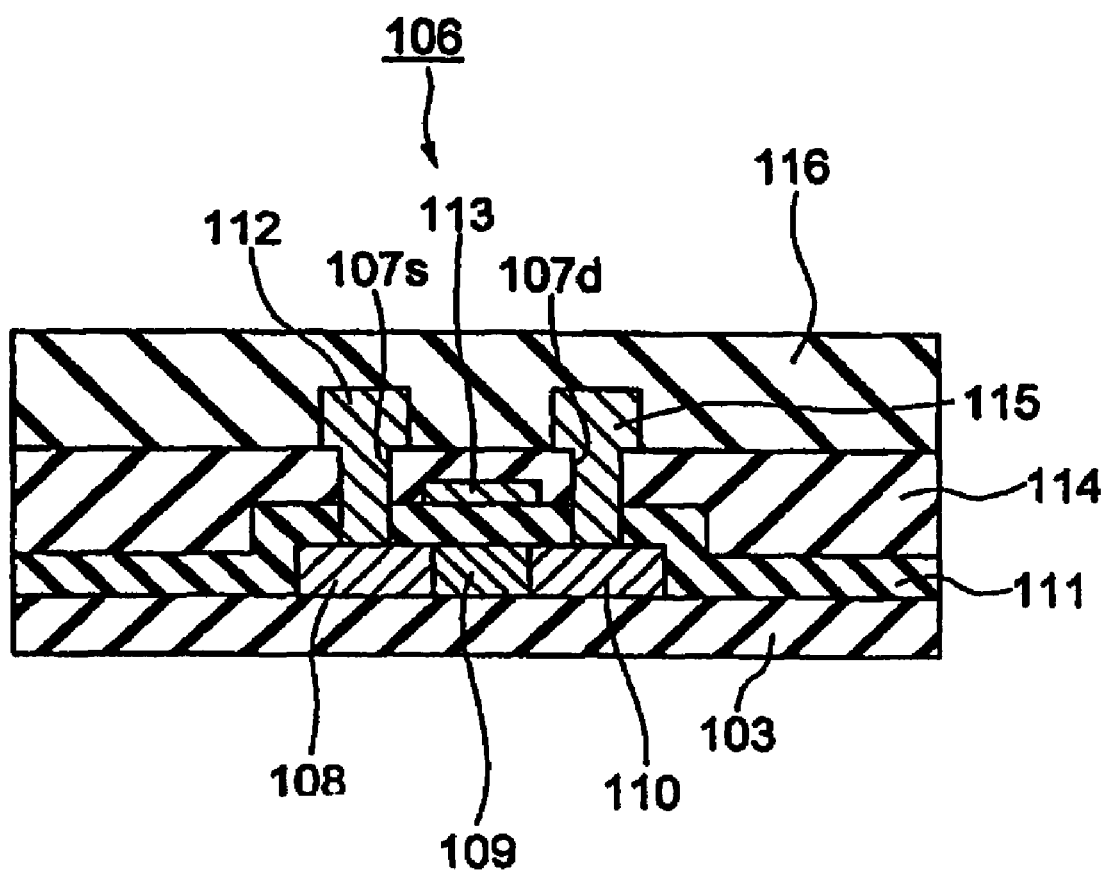
FIG. 2 is a schematic cross-sectional view showing an enlarged view of the TFT of FIG. 1(3).
Figure 3:
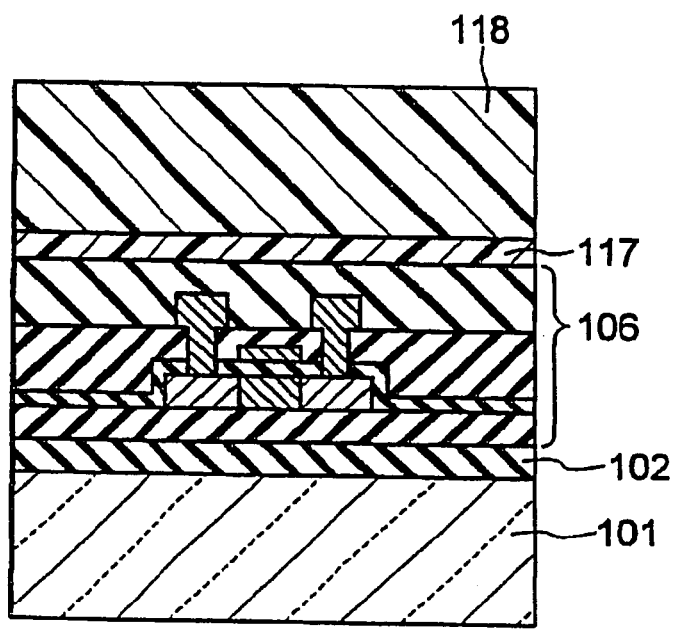
FIG. 3 is a series of schematic cross-sectional views (the second part) illustrating one embodiment of the present invention and the steps of the manufacturing method thereof proceed in the order of FIG. 3(1) to FIG. 3(2).
Figure 3:
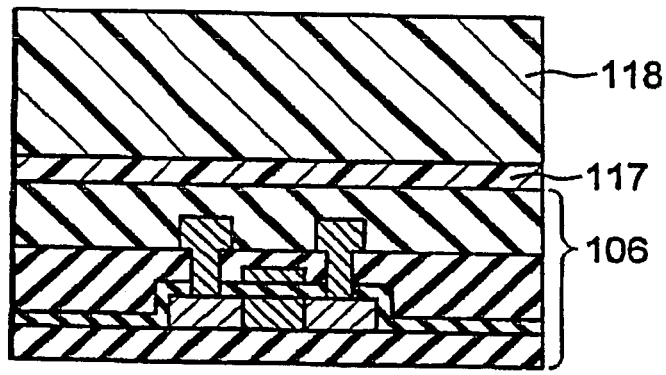
Figure 3:
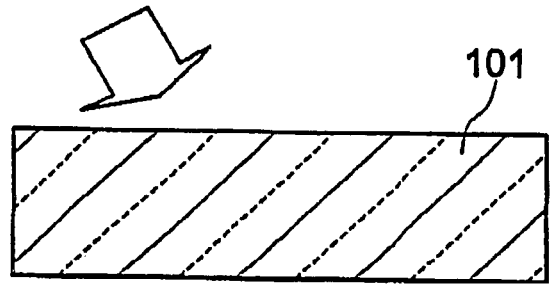

FIGS. 1-3 are a series of schematic cross-sectional views illustrating one embodiment of the present invention. The steps of a manufacturing method thereof proceed in the order of FIG. 1(1), FIG. 1(2), FIG. 1(3), FIG. 3(1) and FIG. 3(2). Referring to these drawings, the embodiment of the present invention is described below. The terms "first substrate", "semiconductor film", "thin film device" and "second substrate" are herein replaced, being embodied, with "glass substrate", "amorphous silicon film", "TFT" and "plastic substrate", respectively.

Firstly, as shown in FIG. 1(1), on a glass substrate 101 having a flat surface, a peeling-off film 102, a silicon oxide film 103 and an amorphous silicon film 104 are formed in succession. The peeling-off film 102 is a film having the gap space. The film having the gap space may be readily obtained if an amorphous silicon oxide film formed by the spin coating method is utilized. Otherwise, there can be employed a silicon oxide film in which gap spaces are formed by selective etching.

Following that, as shown in FIG. 1(2), the amorphous silicon film 104 is irradiated from above with a laser beam 105 of an excimer laser. This melts the amorphous silicon film 104, which then undergoes recrystallization to form a polycrystalline silicon film 104'. On this occasion, because the gap space in the peeling-off film 102 hinders thermal diffusion occurring from the molten amorphous silicon film 104 to the glass substrate 101, the melting time of the amorphous silicon film 104 becomes longer than that in the absence of the peeling-off film 102. As a result, the grain size of crystals in the polycrystalline silicon film 104 becomes greater. Further, the step of this laser annealing can be omitted.

Subsequently, as shown in FIG. 1(3), with this polycrystalline silicon film 104' of large grain size being used as an active layer, a TFT 106 is formed. Hereat, as shown in detail in FIG. 2, after gate insulating film 1 is first formed on the polycrystalline silicon film of large grain size, and channel doping into a channel region 109 is performed, a gate electrode 113 is formed on a gate insulating film 111. Next, after dopants are doped into a source region 108 and a drain region 110, a first interlayer insulating film 114 is formed so as to cover the gate electrode 113 as well as the gate insulating film 111, and contact holes 107s and 107d which run through the first interlayer insulating film 114 and the gate insulating film 111 are formed. Next, a source electrode 112 and a drain electrode 115 which are connected with the source region 108 and the drain region 110 through the contact holes 107s and 107d, respectively, are formed on the fist interlayer insulating film 114. After that, a second interlayer insulating film 116 is formed so as to cover the source electrode 112 and the drain electrode 115, and thereby formation of the TFT 106 is accomplished.

Subsequently, as shown in FIG. 3(1), a plastic substrate 118 is bonded onto the TFT 106 by way of an adhesion layer 117. Finally, as shown in FIG. 3(2), the peeling-off film 102 is removed and the glass substrate 101 is peeled off, and thereby the transfer of the TFT 106 is completed.

Hereat, the substrate peeled off at the end (referred to as the "peeling-off substrate" hereinafter) is not necessarily required to be a glass substrate 101, and a plastic substrate, a metal substrate, a quartz substrate or a layered substrate made of two or more layers of these can be used. The laser for use need not be an excimer laser and can be a solid laser such as a YAG laser or a YLF laser, or a gas laser such as a carbon dioxide gas laser or an argon gas laser. The substrate to which the TFT 106 is transferred (referred to as the "transfer substrate" hereinafter) is not necessarily required to be a plastic substrate 118, and a glass substrate, a metal substrate or a layered substrate made of two or more layers of these can be utilized. In view of the operation of the TFT 106, the thermal conductivity of the transfer substrate is preferably about the same as or greater than the thermal conductivity of silicon oxide. Since the film having the gap space serves as a peeling-off film 102, the methods of peeling off the plastic substrate 118 by permeating an etchant into the gap space therein or by making mechanical break can be employed. The etchant to be permeated can etch the film having the gap spaces itself or etch another film adjacent to the film having the gap spaces. It is not necessarily required that the film structure with gap spaces is formed prior to the fabrication of the TFT 106, and they may be formed while or after the TFT 106 is fabricated. Furthermore, in reality, even the transfer of the TFT 106 need not be made after the TFT formation, and it is possible that the polycrystalline silicon film 104' is transferred immediately after the laser annealing, and, thereafter, the formation of the TFT 106 is made.

As described so far, in the present embodiment, on a glass substrate 101, a peeling-off film 102 is formed, and on the peeling-off film 102 an amorphous silicon film 104 is formed with a silicon oxide film being inserted therebetween, and, forming the amorphous silicon film 104 into a polycrystalline silicon film 104', a TFT 106 is formed therewith, and thereafter a plastic substrate 118 is bonded onto the top of the TFT 106 by way of an adhesion layer 117 and, subsequently, the glass substrate 101 and the peeling-off film 102 are peeled off from this layered structure. As the peeling-off film 102 is made of a film having the gap space, it has characteristically greater etching rates, with the gap space facilitating the etchant to penetrate thereinto, and fragile nature to allow easy break, compared with the film having no gap space. Therefore, the glass substrate 101 can be easily peeled off therefrom by etching, breaking or such. In other words, the laser light is not required to peel off the glass substrate 101 so that even a glass with a low transmittance for the laser light, a silicon impervious to laser light or such can be used as a substrate. Further, because polishing is not used for the peeling-off of the glass substrate 101 herein, the time period necessary for the peeling-off can be reduced. Moreover, as the etchant penetrates through the gap space, even formation of the trenches on the surface of the glass substrate 101 is unnecessary to make the etchant penetrate. Accordingly, trench fabrication on the surface of the glass substrate 101 is unneeded and the TFT 106 formed on the glass substrate 101 may have excellent pattern accuracy.

Further, the present embodiment is not limited to a method of manufacturing a TFT 106 and the area of its application include other thin film devices such as a solar cell.

Next, examples of the present embodiment are further described in detail below.

FIRST EXAMPLE

Figure 4:
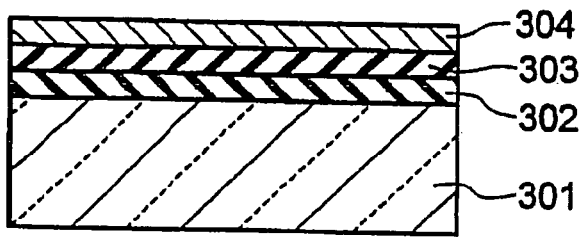
FIG. 4 is a series of schematic cross-sectional views (the first part) illustrating Example 1 of the present invention and the steps of a manufacturing method thereof proceed in the order of FIG. 4(1) to FIG. 4(4).
Figure 4:
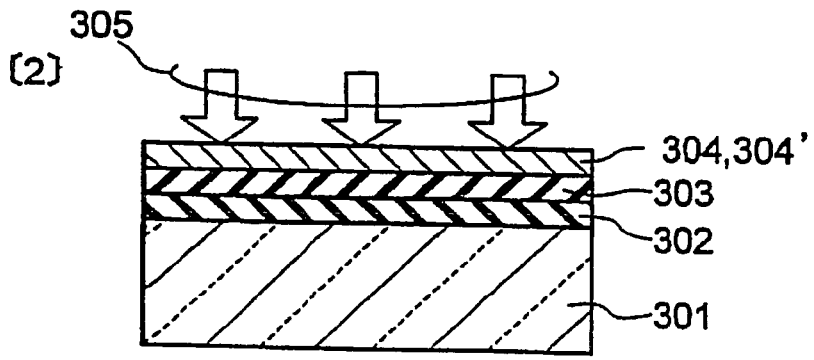
Figure 4:
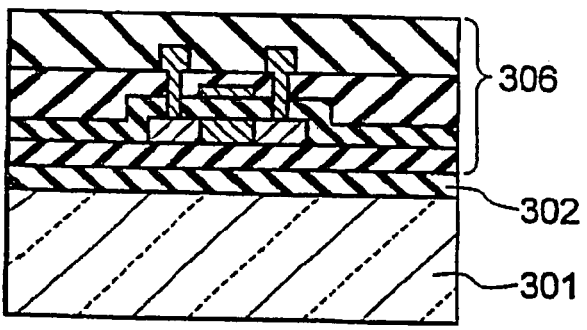
Figure 4:
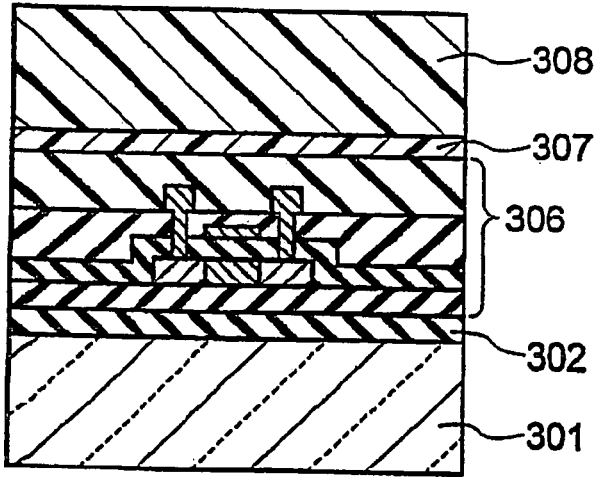
Figure 5:
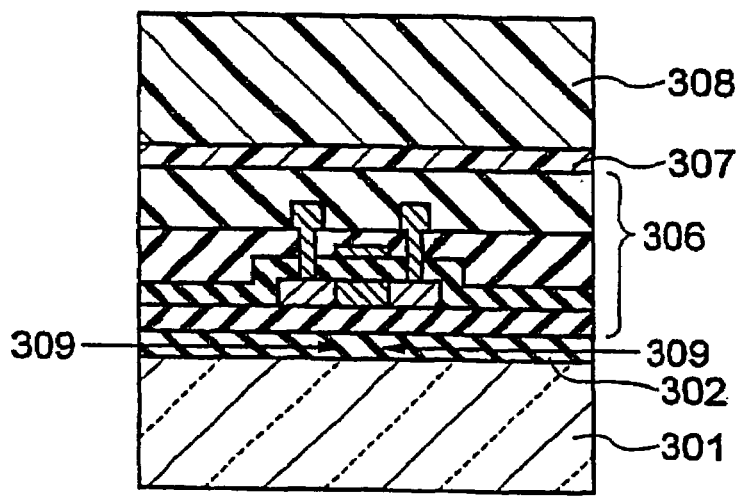
FIG. 5 is a series of schematic cross-sectional views (the second part) illustrating Example 1 of the present invention and the steps of the manufacturing method thereof proceed in the order of FIG. 5(1) to FIG. 5(3).
Figure 5:
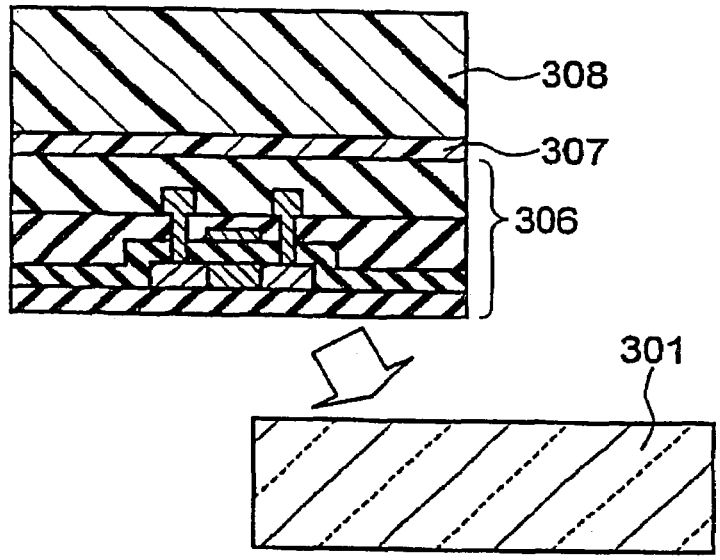
Figure 5:
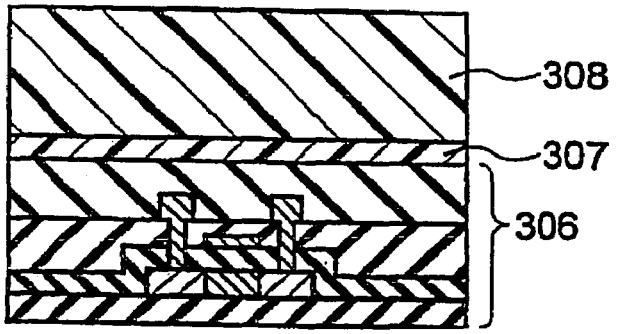

FIGS. 4 and 5 are a series of schematic cross-sectional views illustrating Example 1 of the present invention. The steps of a manufacturing method thereof proceed in the order of FIG. 4(1), FIG. 4(2), FIG. 4(3), FIG. 4(4), FIG. 5(1), FIG. 5(2) and FIG. 5(3). Referring to these drawings, the embodiment of the present invention is described below.

Firstly, as shown in FIG. 4(1), on a glass substrate 301, a porous silicon oxide film 302 is formed by the spin coating method as a peeling-off film, and on the porous silicon oxide film 302 a silicon oxide film 303 is formed, and then an amorphous silicon oxide film 304 is formed by the LPCVD (Low Pressure Chemical Vapor Deposition) method. A liquid used in this spin coating method is, for example, a solution of silanol-based monomers or oligomers dissolved in an organic solvent such as alcohol or ketone or a solution in which fine powders of silicon oxide are dispersed and suspended in an organic solvent. By dropping the liquid onto the glass substrate 301, making its application for coating uniform with a spinner and then heating up to a temperature, for instance, 200° C. to 300° C., the porous silicon oxide film 302 can be formed.

Following that, as shown in FIG. 4(2), the amorphous silicon film 304 is irradiated from above with a laser beam 305 of an excimer laser to obtain a polycrystalline silicon film 304' of large grain size. The step of this laser annealing can be omitted. Subsequently, as shown in FIG. 4(3), with this polycrystalline silicon film 304' being used as an active layer, a TFT 306 is formed. As the method of forming the TFT 306, a conventional method of forming on a glass substrate at a low temperature may be used. The structure of the TFT 306 is the same as shown in FIG. 2. After that, as show in FIG. 4(4), a plastic substrate 308 is bonded onto the top of the TFT 306 by way of an adhesion layer 307.

Next, as shown in FIG. 5(1), a layered structure between the glass substrate 301 and the plastic substrate 308 is immersed into hydrofluoric acid 309. When, seen from above, hydrofluoric acid 309 penetrates to the porous silicon oxide film 302 lying over the center of the glass substrate 301, selective etching of the porous silicon oxide film 302 becomes possible to be conducted, because the etching rate of the porous silicon oxide is greater than that of silicon oxide. Consequently, as shown in FIG. 5(2), the glass substrate 301 is peeled off. Now, as shown in FIG. 5(3), the transfer of the TFT 306 is completed.

With respect to the transfer substrate, it is not necessary to be a plastic substrate 308, and a glass substrate, a metal substrate or a layered substrate of two or more of these can be utilized. The thermal conductivity of the transfer substrate is preferably not less than that of silicon oxide.

SECOND EXAMPLE

Figure 6:
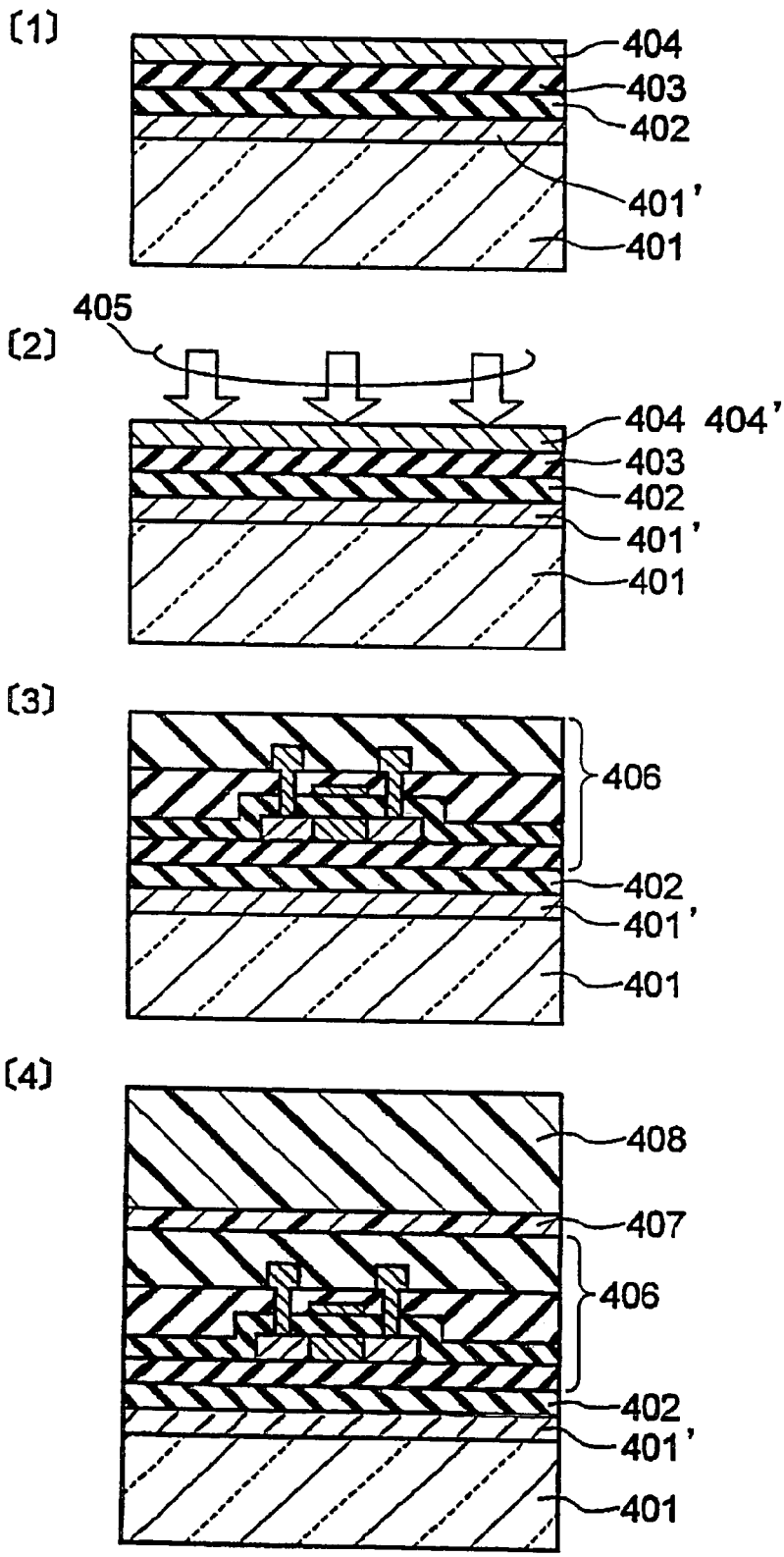
FIG. 6 is a series of schematic cross-sectional views (the first part) illustrating Example 2 of the present invention and the steps of a manufacturing method thereof proceed in the order of FIG. 6(1) to FIG. 6(4).
Figure 7:
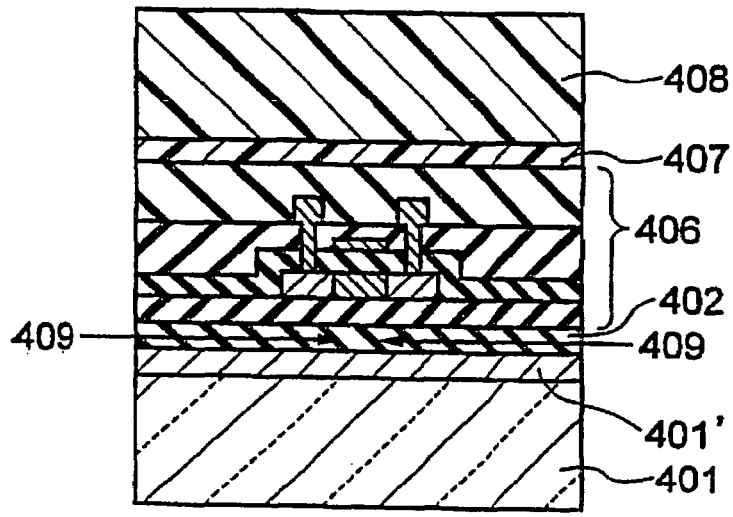
FIG. 7 is a series of schematic cross-sectional views (the second part) illustrating Example 2 of the present invention and the steps of the manufacturing method thereof proceed in the order of FIG. 7(1) to FIG. 7(3).
Figure 7:
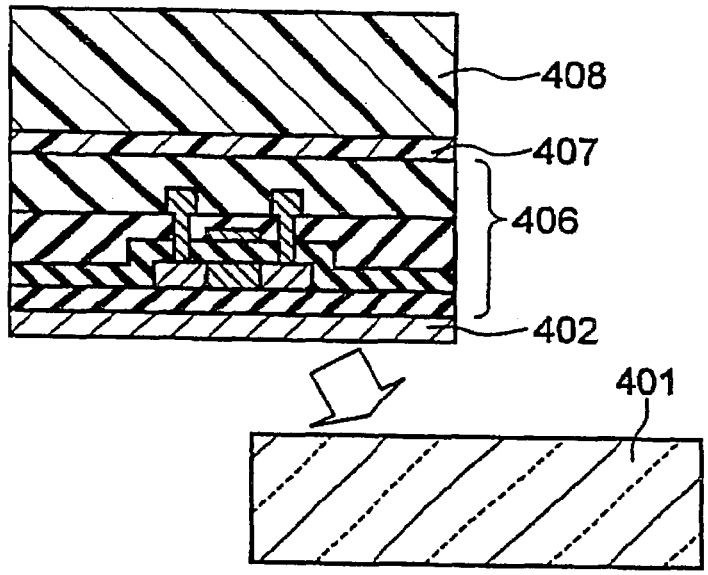
Figure 7:
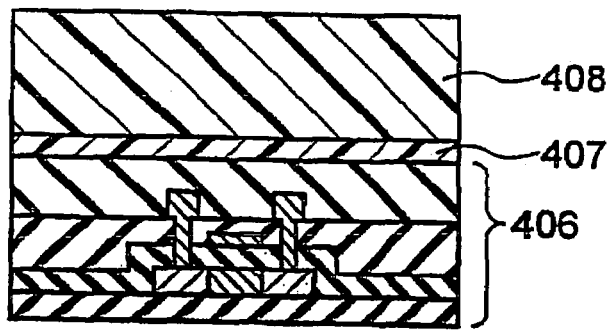

FIGS. 6 and 7 are a series of schematic cross-sectional views illustrating Example 2 of the present invention. The steps of a manufacturing method thereof proceed in the order of FIG. 6(1), FIG. 6(2), FIG. 6(3), FIG. 6(4), FIG. 7(1), FIG. 7(2) and FIG. 7(3). Referring to these drawings, the embodiment of the present invention is described below.

As shown in FIG. 6(1), on a glass substrate 401, a chromium film 401' is first formed as a second peeling-off film, for example, by the sputtering method, and on the chromium film 401' a porous silicon oxide film 402 is formed as a first peeling-off film by the spin coating method, and, then, on the porous silicon oxide film 402 a silicon oxide film 403 is formed by the plasma CVD method, and thereon an amorphous silicon film 404 is further formed by the thermal CVD method. Following that, as shown in FIG. 6(2), the amorphous silicon film 404 is irradiated from above with a laser beam 405 of an excimer laser to obtain a polycrystalline silicon film 404'. Since the presence of the porous silicon oxide film 402 inhibits heat conduction from the amorphous silicon film 404 whose temperature is raised by the laser annealing, the recrystallizing time becomes longer than that in the conventional methods wherein no amorphous silicon oxide film 402 is used and, therefore, silicon crystals with larger grain size can be attained. However, the step of this laser annealing can be omitted.

Subsequently, as shown in FIG. 6(3), with this polycrystalline silicon film 404' being used as an active layer, a TFT 406 is formed. As the method of forming the TFT 406, a conventional method of forming a TFT on a glass substrate at a low temperature may be used. The structure of the TFT 346 is the same as shown in FIG. 2. After that, as show in FIG. 6(4), a plastic substrate 408 is bonded onto the TFT 406 by way of an adhesion layer 407.

Next, as shown in FIG. 7(1), a layered structure between the glass substrate 401 and the plastic substrate 408 is immersed into chromium etchant 409. When, seen from above, the chromium etchant 409 penetrates to the porous silicon oxide film 402 lying over the center of the glass substrate 401, the chromium etchant 409 permeates the whole interface between the porous silicon oxide film 402 and the chromium film 401'. Consequently, as shown in FIG. 7(2), the glass substrate 401 is peeled off by way of the chromium film 401'. Finally, the porous silicon oxide film 402 is removed by means of etching or such, and thereby, as shown in FIG. 7(3), the transfer of the TFT 406 is completed.

For the material to form a second peeling-off film like the chromium film 401', any one of metals, semiconductors and insulators other than chromium can be used as a substitute, but a material with a low thermal conductivity is preferably used so that a crystalline silicon film of large grain size may be obtained. Further, the chromium film 401' may be formed either over or under the porous silicon oxide film 402.

THIRD EXAMPLE

FIGS. 8-17 are sets of schematic views illustrating Example 3 of the present invention, each set showing a plan view and one or two cross-sectional views. The steps of a manufacturing method thereof proceeds in the order of FIG. 8, FIG. 9, FIG. 10, FIG. 11, FIG. 12, FIG. 13, FIG. 14, FIG.

Figure 16:
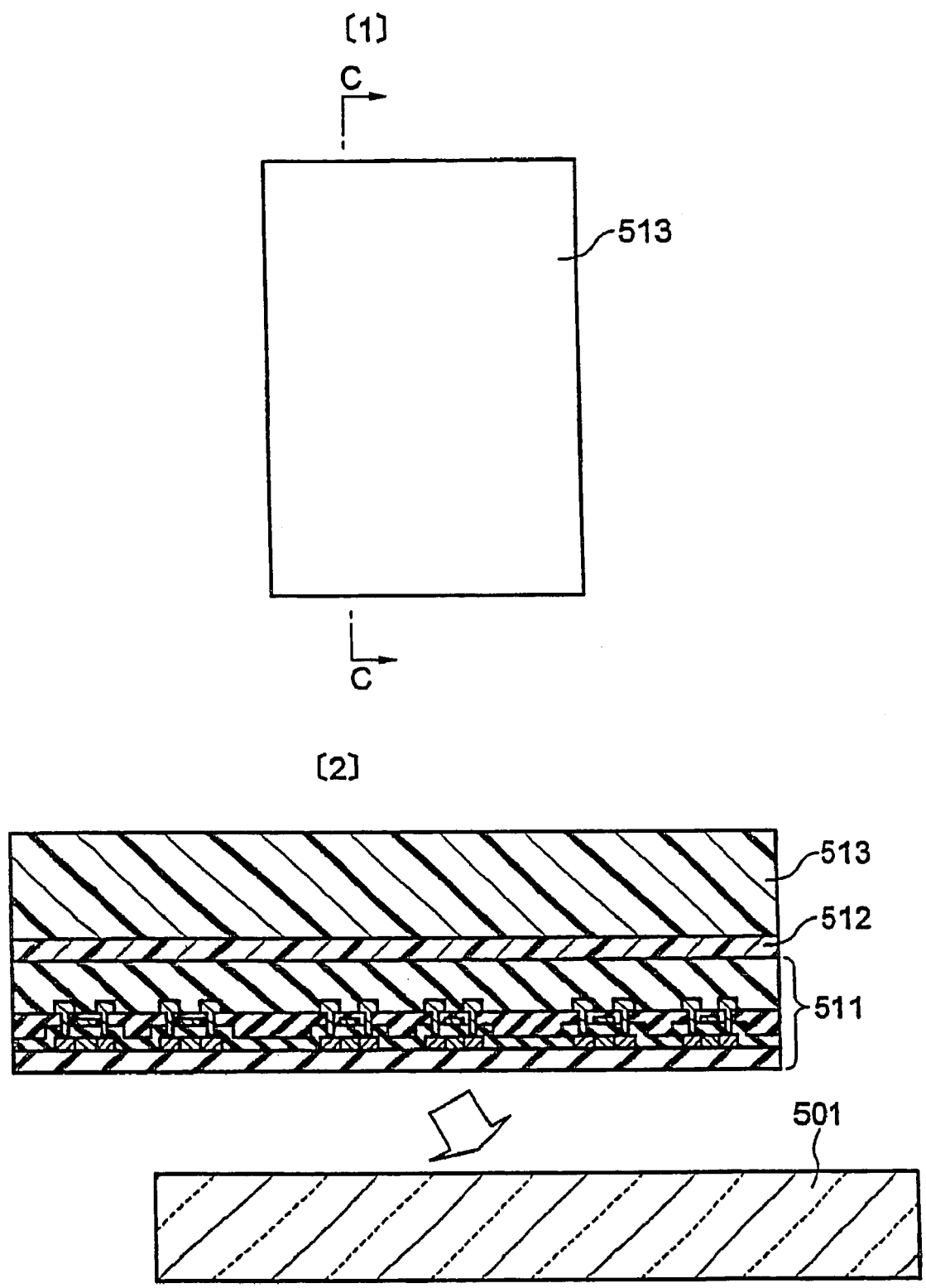
FIG. 16 is a pair of schematic views illustrating Example 3 of the present invention (the ninth part), in which a plan view thereof is shown in FIG. 16(1) and a vertical sectional view taken on line C-C of FIG. 16(1), in FIG. 16(2).
Figure 17:
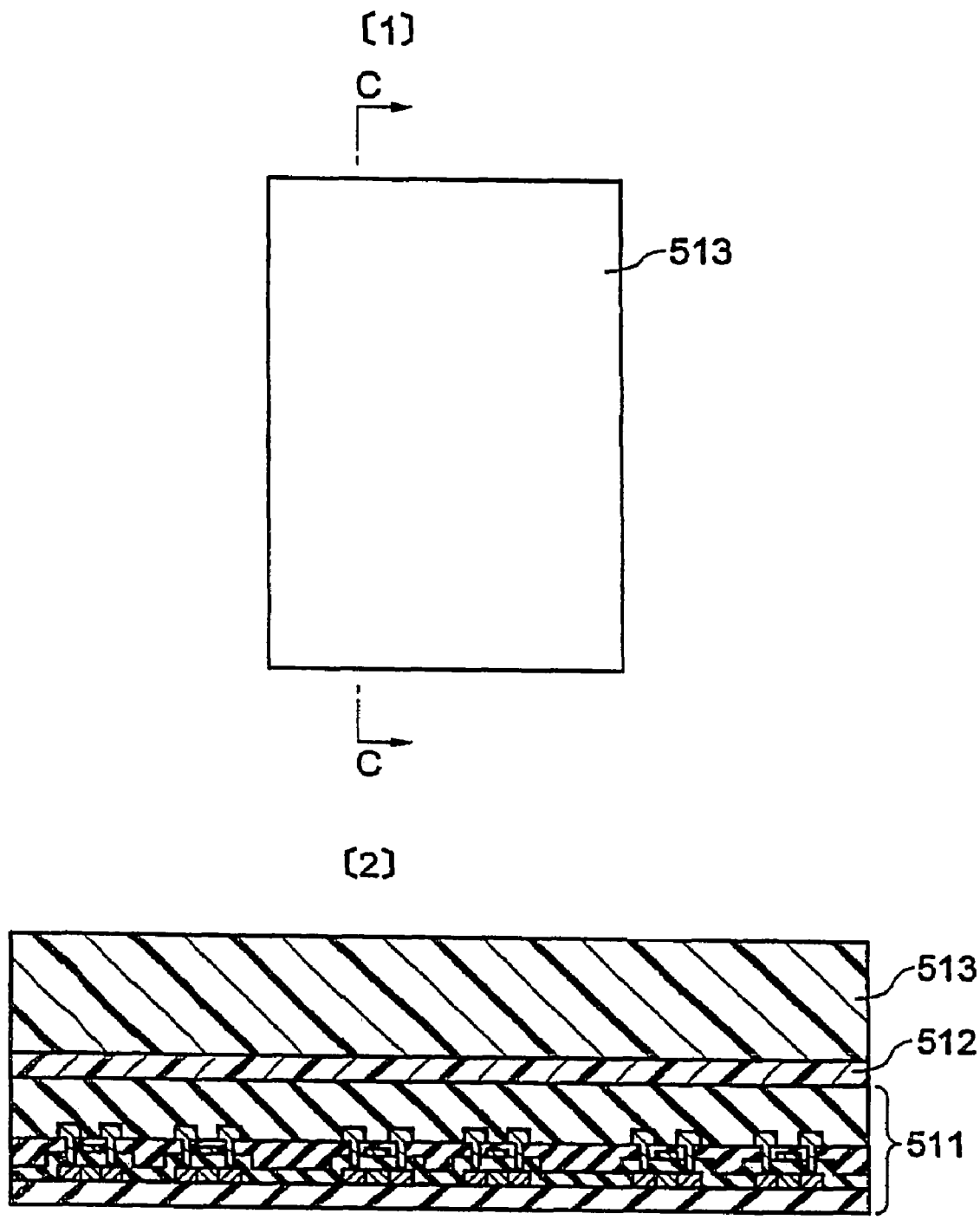
FIG. 17 is a pair of schematic views illustrating Example 3 of the present invention (the tenth part), in which a plan view thereof is shown in FIG. 17(1) and a vertical sectional view taken on line C-C of FIG. 17(1), in FIG. 17(2).

15, FIG. 16 and FIG. 17. Referring to these drawings, the embodiment of the present invention is described below.

Figure 8:
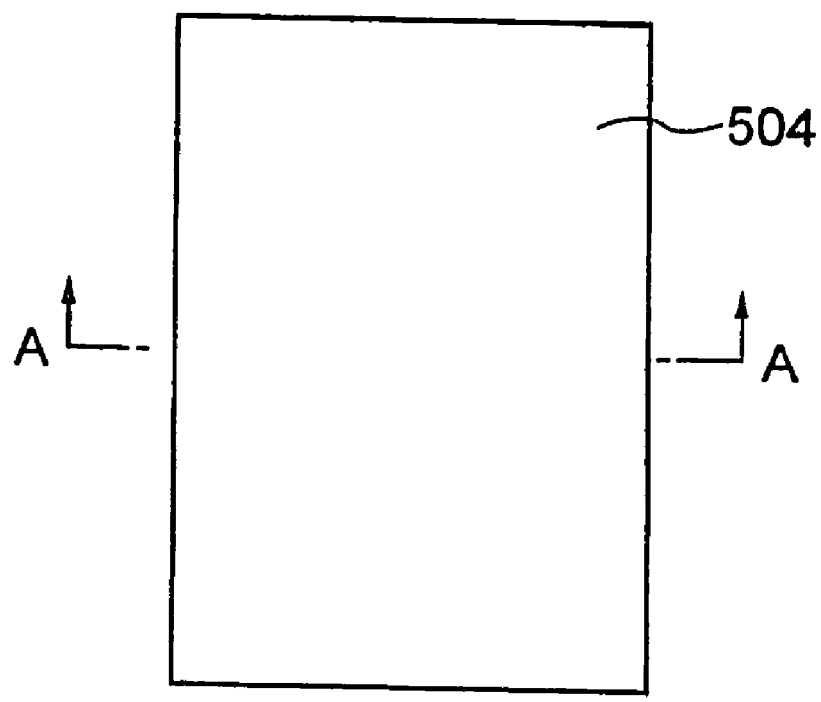
FIG. 8 is a pair of schematic views illustrating Example 3 of the present invention (the first part), in which a plan view thereof is shown in FIG. 8(1) and a portion of a vertical sectional view taken on line A-A of FIG. 8(1), in FIG. 8(2).
Figure 8:
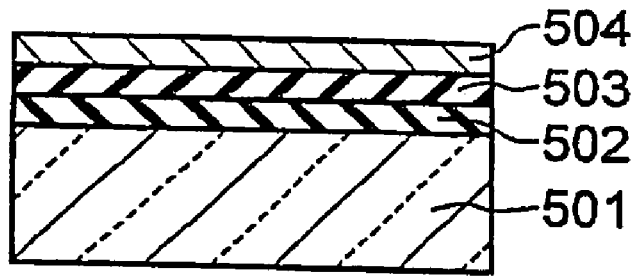

Firstly, as shown in FIG. 8, on a glass substrate 501, a silicon oxide film 502, a silicon nitride film 503 and an amorphous silicon oxide film 504 are successively formed in this order. The silicon nitride film 503 is formed by the PECVD (Plasma-Enhanced CVD) method. In this instance, hydrogen is fed into the CV chamber as a source gas, whereby a silicon nitride film containing a considerable amount of hydrogen is formed. In this way, the etching rate of silicon nitride by hydrofluoric acid can be made very small in comparison with that of silicon oxide.

Figure 9:
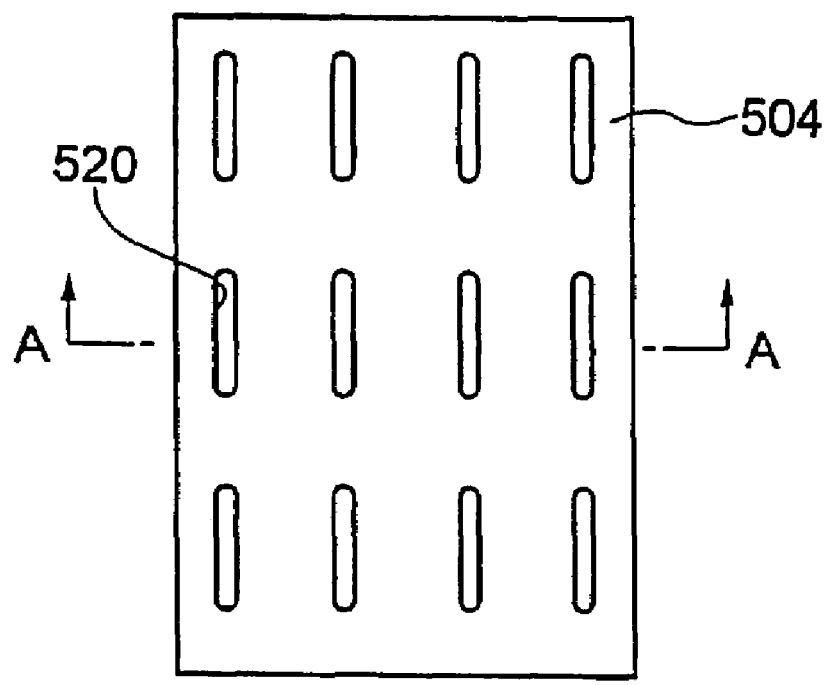
FIG. 9 is a pair of schematic views illustrating Example 3 of the present invention (the second part), in which a plan view thereof is shown in FIG. 9(1) and a portion of a vertical sectional view taken on line A-A of FIG. 9(1), in FIG. 9(2).
Figure 9:
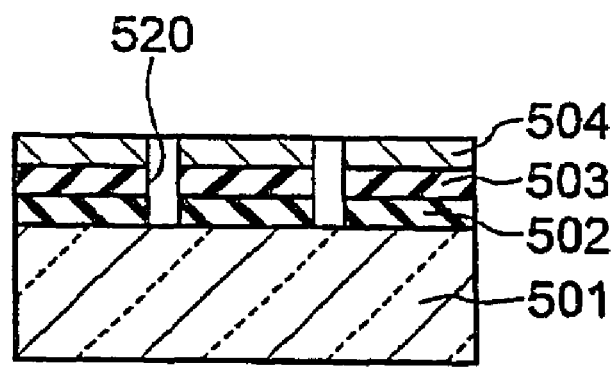

Next, as shown in FIG. 9, a photoresist film (not shown in the drawings) having a pattern with numerous long holes is formed by photolithography, and the silicon oxide film 502, the silicon nitride film 503 and the amorphous silicon film 504 are etched by means of dry etching down to the glass substrate 501, whereby numerous etchant supply holes 520 are formed to reach the glass substrate 501.

Figure 10:
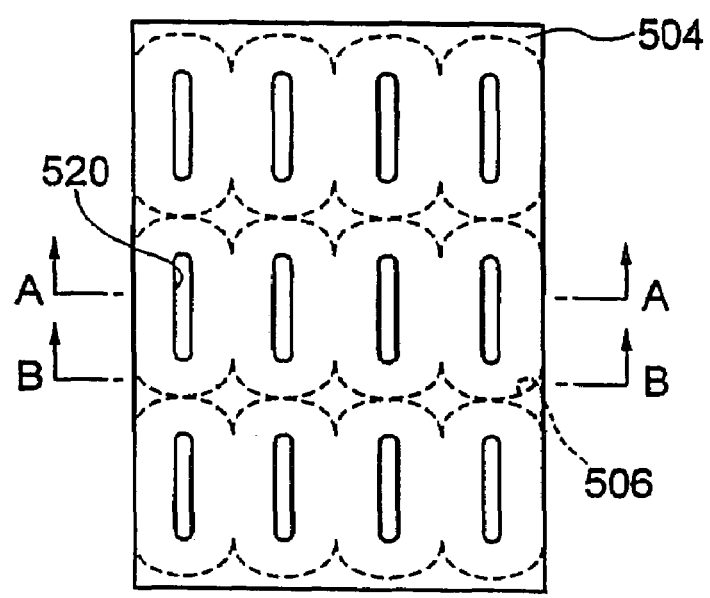
FIG. 10 is a set of schematic views illustrating Example 3 of the present invention (the third part), in which a plan view thereof is shown in FIG. 10(1), a portion of a vertical sectional view taken on line A-A of FIG. 10(1), in FIG. 10(2)(A) and a portion of a vertical sectional view taken on line B-B of FIG. 10(1), in FIG. 10(2)(B).
Figure 10:
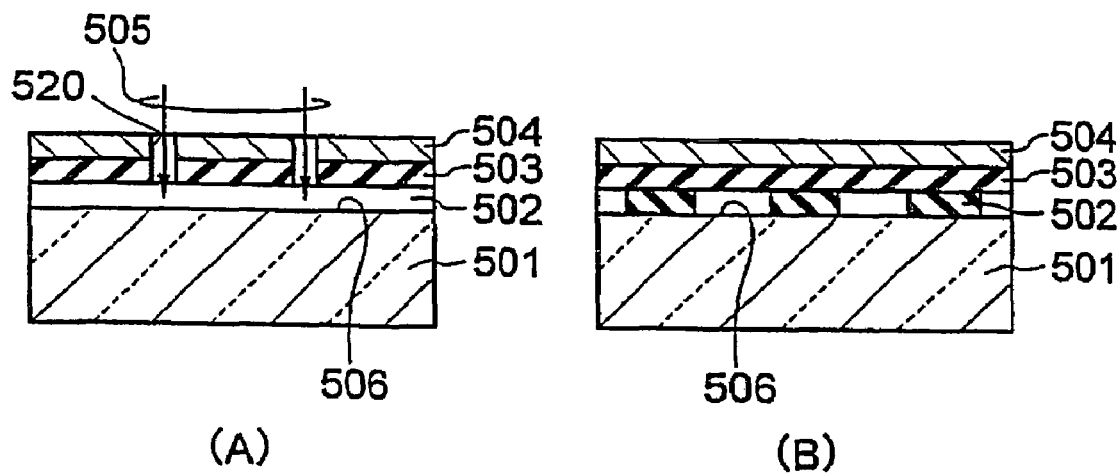

Subsequently, as shown in FIG. 10, the glass substrate 501 wherein the etchant supply holes 520 have been formed is immersed into hydrofluoric acid 505. Since the etching rate of the silicon nitride film 503 is lower than those of the silicon oxide film 502 and the glass substrate 501, etched regions in the silicon oxide film 502 expand elliptically, centering around respective etchant supply holes 520, and gap spaces 506 are formed, which results in a structure wherein the flat silicon nitride film 503 and amorphous silicon film 504 overlie the silicon oxide film 502 remaining in the form of pillars.

Figure 11:
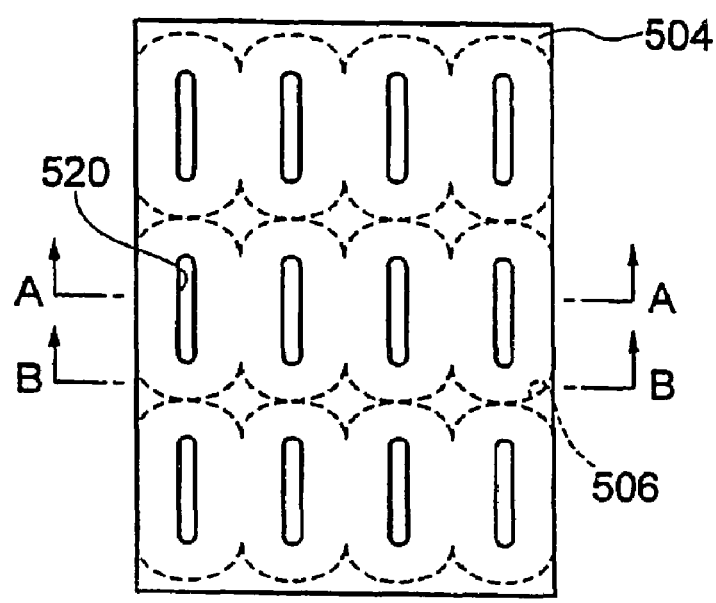
FIG. 11 is a set of schematic views illustrating Example 3 of the present invention (the fourth part), in which a plan view thereof is shown in FIG. 11(1), a portion of a vertical sectional view taken on line A-A of FIG. 11(1), in FIG. 11(2)(A) and a portion of a vertical sectional view taken on line B-B of FIG. 11(1), in FIG. 11(2)(B).
Figure 11:
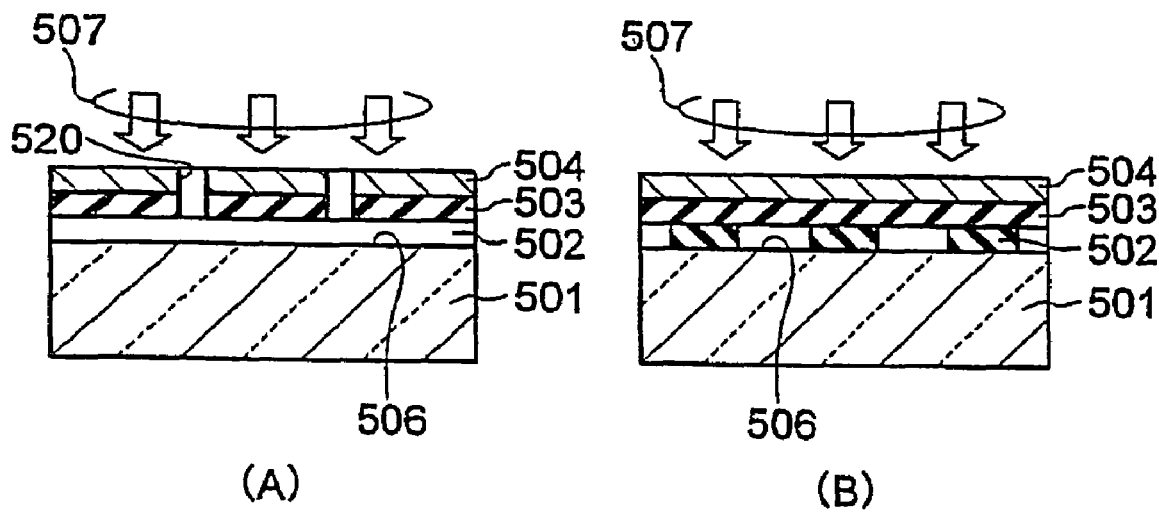
Figure 12:
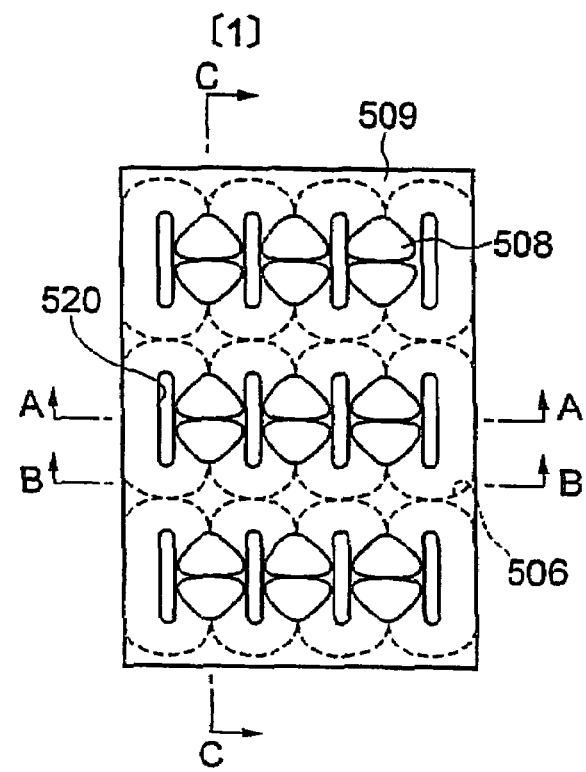
FIG. 12 is a set of schematic views illustrating Example 3 of the present invention (the fifth part), in which a plan view thereof is shown in FIG. 12(1), a portion of a vertical sectional view taken on line A-A of FIG. 12(1), in FIG. 12(2)(A), a portion of a vertical sectional view taken on line B-B of FIG. 12(1), in FIG. 12(2)(B) and a vertical sectional view taken on line C-C of FIG. 12(1), in FIG. 12(2)(C).
Figure 12:
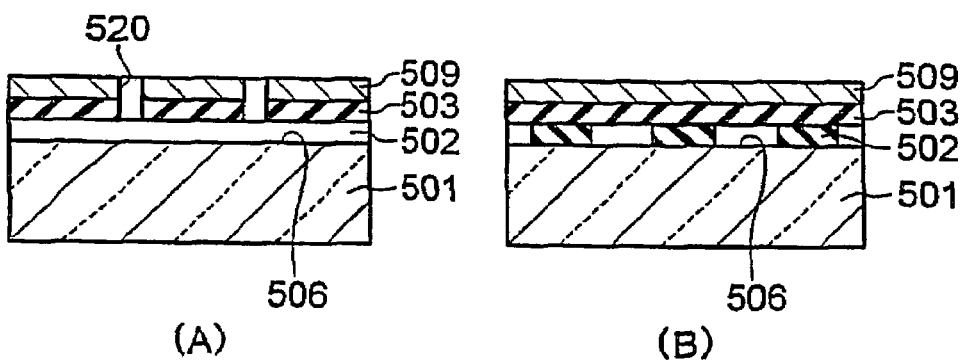
Figure 12:
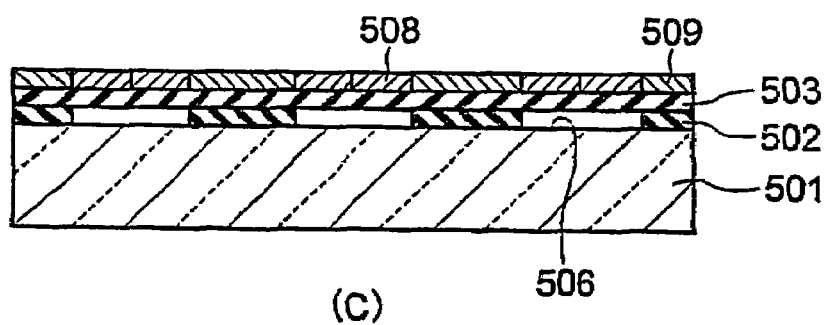

Following that, as shown in FIG. 11, the amorphous silicon film 504 is irradiated from above with a laser beam 507 of an excimer laser to melt the amorphous silicon film 504. The thermal diffusion rate in the longitudinal direction (in the direction of the substrate thickness) for the amorphous silicon film 504 situated above the gap spaces 506 is smaller than that for the amorphous oxide film 504 situated above the silicon oxide film in the form of pillars. This generates a thermal gradient within the amorphous silicon film 504 of the molten state and, in consequence, crystal nuclei are formed in the amorphous silicon film 504 situated above the outline of the pillars-shaped silicon oxide film 502, and with these crystal nuclei serving as seeds, crystals grow in the transverse direction (in the direction of the substrate surface plane) as shown in FIG. 12, and thereby grains 508 are selectively formed. Further, the amorphous silicon other than that forming grains 508 becomes microcrystals 509. The step of this laser annealing can be omitted.

Figure 13:
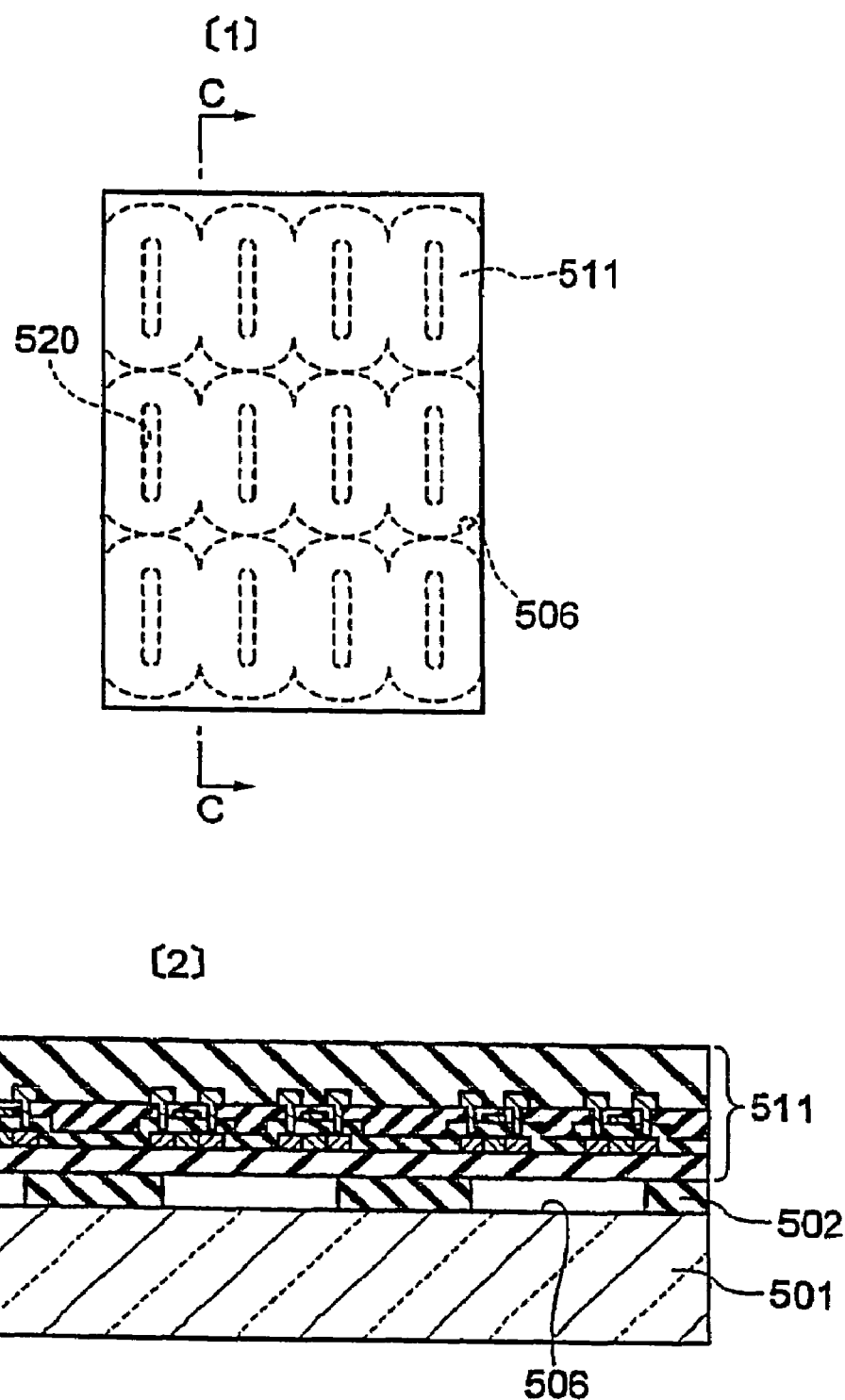
FIG. 13 is a pair of schematic views illustrating Example 3 of the present invention (the sixth part), in which a plan view thereof is shown in FIG. 13(1) and a vertical sectional view taken on line C-C of FIG. 13(1), in FIG. 13(2).
Figure 14:
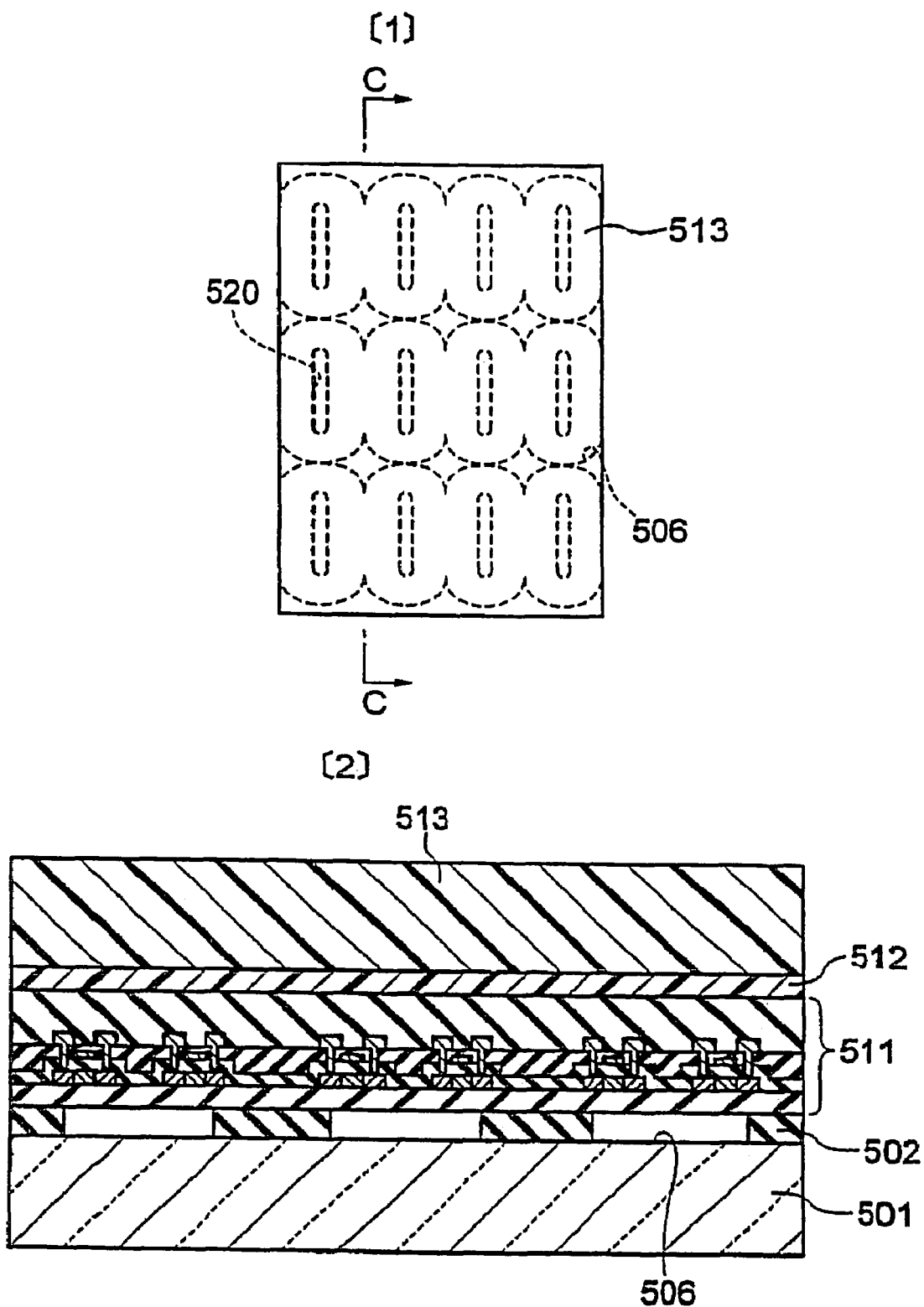
FIG. 14 is a pair of schematic views illustrating Example 3 of the present invention (the seventh part), in which a plan view thereof is shown in FIG. 14(1) and a vertical sectional view taken on line C-C of FIG. 14(1), in FIG. 14(2).

Subsequently, as shown in FIG. 13, with these grains 508 being used as an active layer, TFTs 511 are formed. The structure of the TFT 511 is the same as shown in FIG. 2. After that, as shown in FIG. 14, a plastic substrate 513 is bonded onto the top of the TFT 511 by way of an adhesion layer 512.

Figure 15:
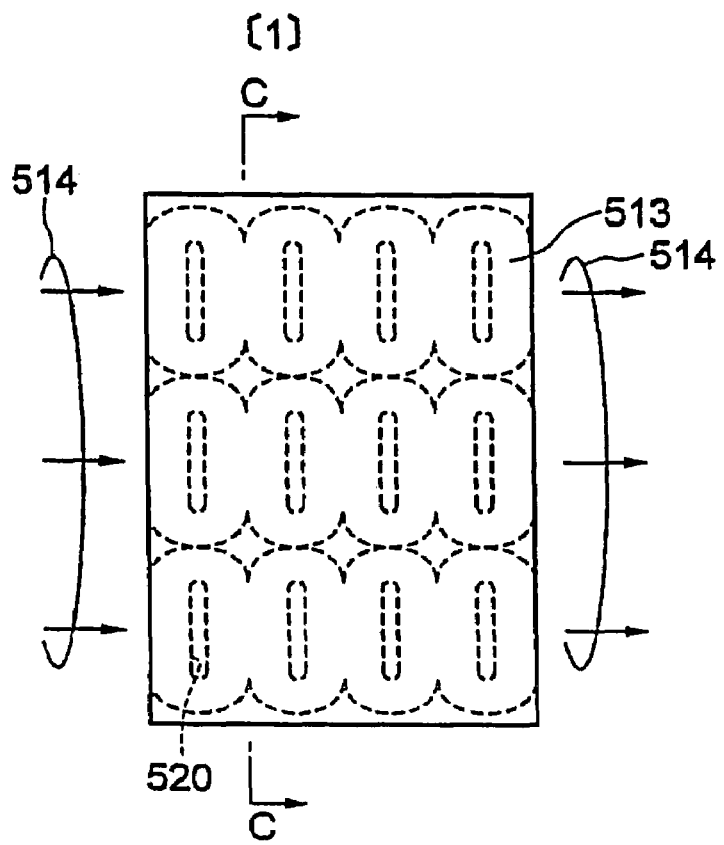
FIG. 15 is a pair of schematic views illustrating Example 3 of the present invention (the eighth part), in which a plan view thereof is shown in FIG. 15(1) and a vertical sectional view taken on line C-C of FIG. 15(1), in FIG. 15(2).
Figure 15:
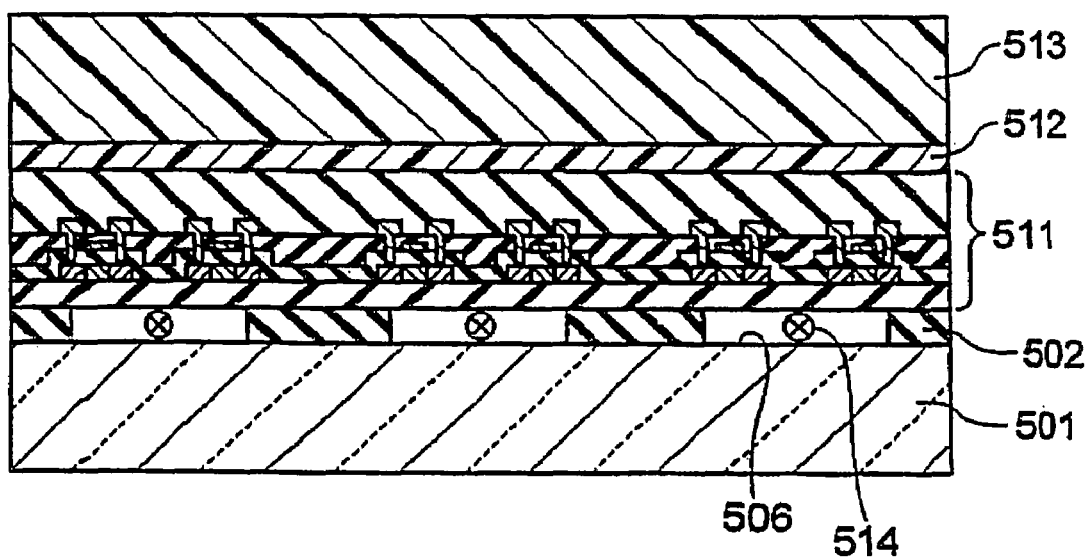

Next, as shown in FIG. 15, a layered structure between the glass substrate 501 and the plastic substrate 513 is immersed into hydrofluoric acid 514. The hydrofluoric acid 514 penetrates from the transverse direction of the glass substrate 501, and permeates through the gap spaces 506 into the whole silicon oxide film 502 which is left in the form of the pillars. This induces hydrofluoric acid 513 to etch the pillars-shaped silicon oxide film 502, and consequently, as shown in FIG. 16, the glass substrate 501 can be peeled off. Now, as shown in FIG. 17, the transfer of the TFTs 511 is completed.

Further, as a substitute for the silicon oxide film 502, any one of metals, semiconductors and insulators can be used, but a material with a low thermal conductivity is preferably used so that a crystalline silicon film of large grain size may be obtained.

FOURTH EXAMPLE

FIGS. 18-25 are pairs of schematic views illustrating Example 4 of the present invention, each pair showing a plan view and a cross-sectional view. The steps of a manufacturing method thereof proceeds in the order of FIG. 18, FIG. 19, FIG. 20, FIG. 21, FIG. 22, FIG. 23, FIG. 24 and FIG. 25. Referring to these drawings, the embodiment of the present invention is described below.

Figure 18:
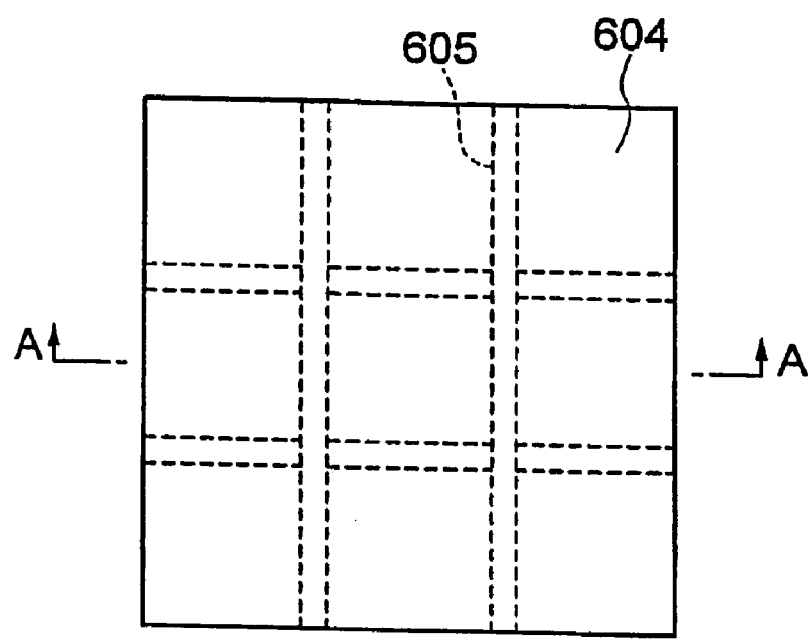
FIG. 18 is a pair of schematic views illustrating Example 4 of the present invention (the first part), in which a plan view thereof is shown in FIG. 18(1) and a vertical sectional view taken on line A-A of FIG. 18(1), in FIG. 18(2).
Figure 18:
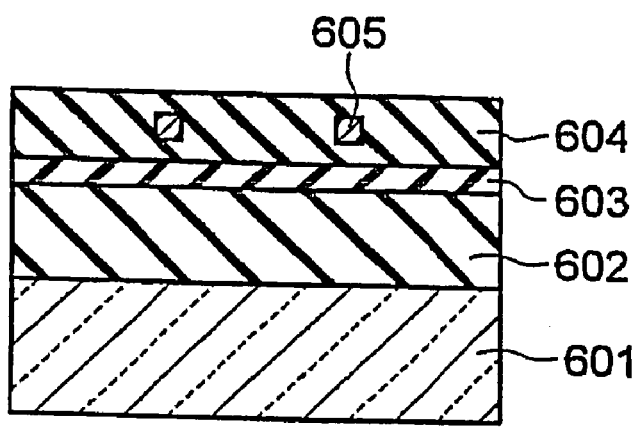

Firstly, as shown in FIG. 18, on a glass substrate 601, a silicon oxide film 602 and a silicon nitride film 603 are formed in succession, and then along with forming ordinary TFTs (not shown in the drawings), interconnections 605 covered with an interlayer insulating film 604 are formed. The silicon oxide film 602 is to serve as a peeling-off film (a film having gap spaces). The silicon nitride film 603 is formed by the plasma CVD. In this instance, hydrogen is fed into the CV chamber as a source gas, whereby a silicon nitride film 603 containing a considerable amount of hydrogen is formed. In this way, the etching rate of the silicon nitride film 603 by hydrofluoric acid can be made very small in comparison with that of silicon oxide.

Figure 19:
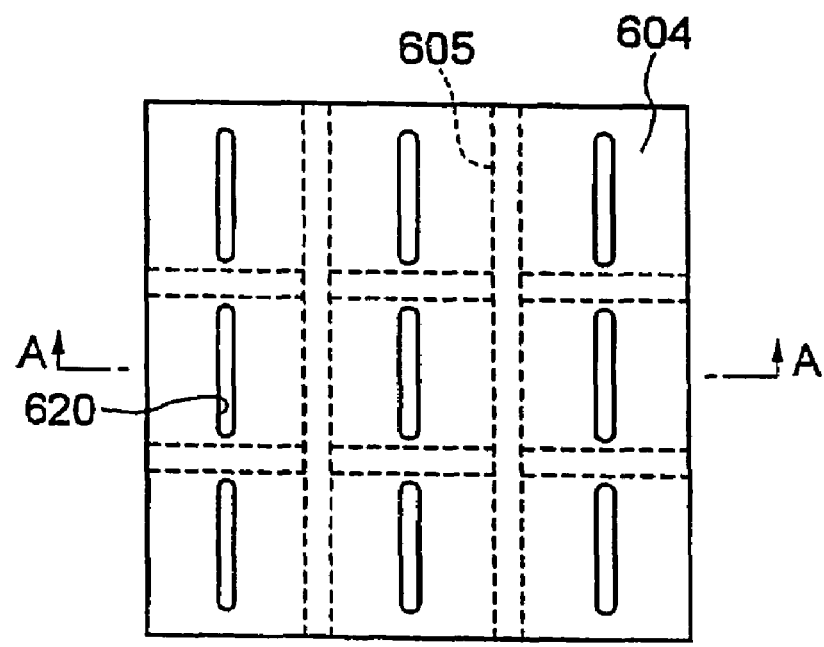
FIG. 19 is a pair of schematic views illustrating Example 4 of the present invention (the second part), in which a plan view thereof is shown in FIG. 19(1) and a vertical sectional view taken on line A-A of FIG. 19(1), in FIG. 19(2).
Figure 19:
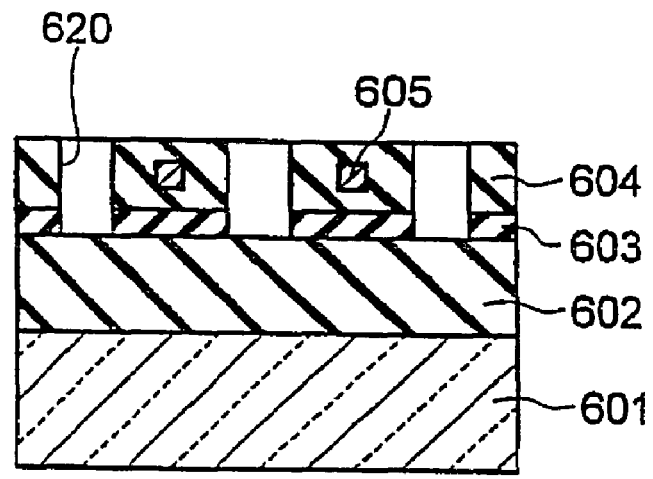

Next, as shown in FIG. 19, a photoresist film (not shown in the drawings) having a pattern with numerous long holes is formed by photolithography, and the silicon nitride film 603 and the interlayer insulating film 604 are etched by means of dry etching down to the silicon oxide film 602, whereby numerous etchant supply holes 620 are formed to reach the silicon oxide film 602.

Figure 20:
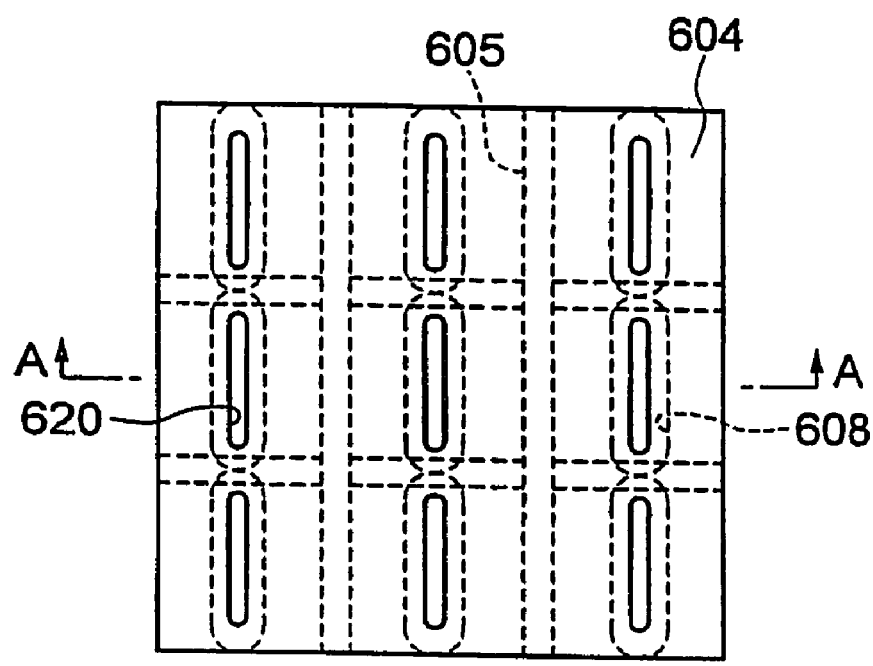
FIG. 20 is a pair of schematic views illustrating Example 4 of the present invention (the third part), in which a plan view thereof is shown in FIG. 20(1) and a vertical sectional view taken on line A-A of FIG. 20(1), in FIG. 20(2).
Figure 20:
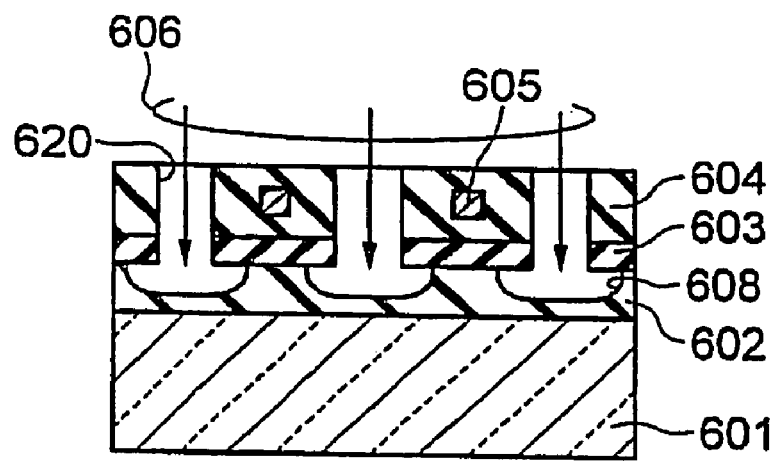

Subsequently, as shown in FIG. 20, the glass substrate 601 wherein the etchant supply holes 620 have been formed is immersed into hydrofluoric acid 606. Since the etching rate of the silicon nitride film 603 is lower than that of the silicon oxide film 602, etched regions in the silicon oxide film 602 expand elliptically, centering around respective etchant supply holes 620, and gap spaces 608 are formed, which results in a structure wherein the flat silicon nitride film 603 and such overlie the silicon oxide film 602 remaining in the form of pillars. The etching hereat is isotropic wet etching so that the gap spaces 608 expand even under the TFTs and the interconnections 605.

Figure 21:
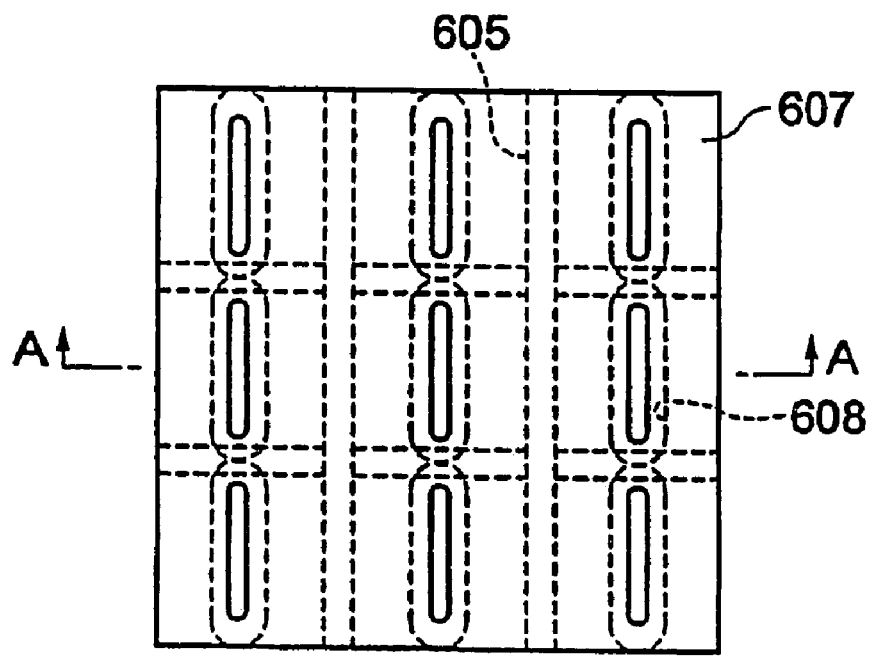
FIG. 21 is a pair of schematic views illustrating Example 4 of the present invention (the fourth part), in which a plan view thereof is shown in FIG. 21(1) and a vertical sectional view taken on line A-A of FIG. 21(1), in FIG. 21(2).
Figure 21:
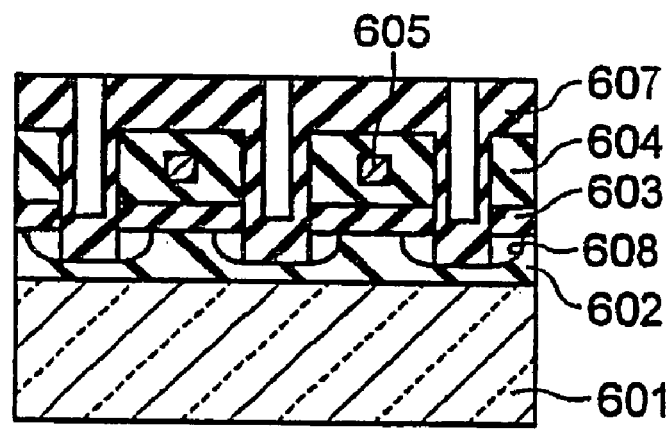
Figure 22:
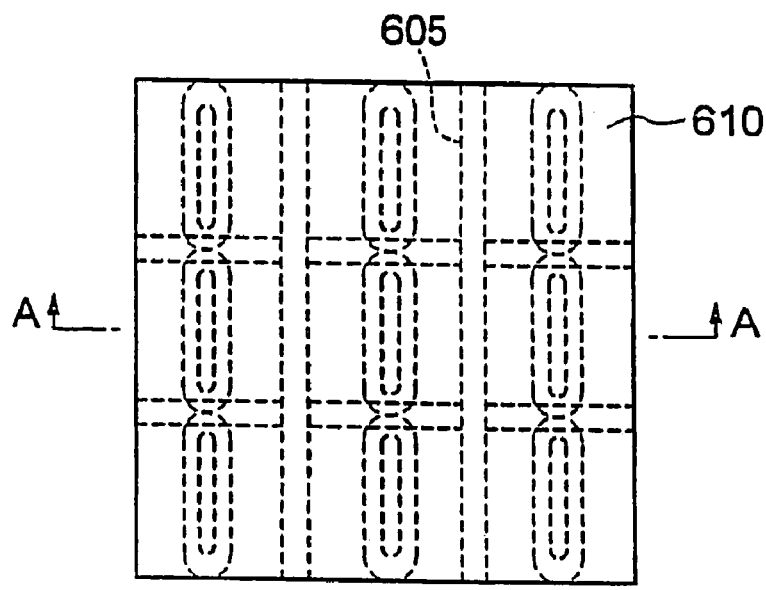
FIG. 22 is a pair of schematic views illustrating Example 4 of the present invention (the fifth part), in which a plan view thereof is shown in FIG. 22(1) and a vertical sectional view taken on line A-A of FIG. 22(1), in FIG. 22(2).
Figure 22:
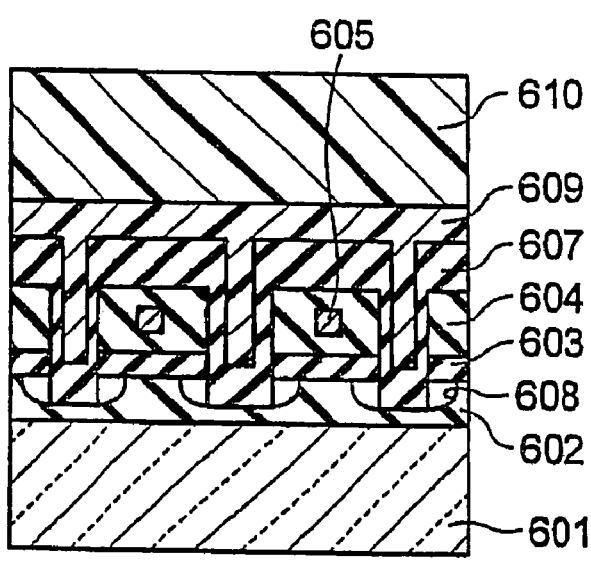

Subsequently, as shown in FIG. 21, on the interlayer insulating film 604 and the gap spaces 608, a silicon nitride film 607 is formed. After that, as show in FIG. 22, a plastic substrate 610 is bonded onto the silicon nitride film 607 by way of an adhesion layer 609.

Figure 23:
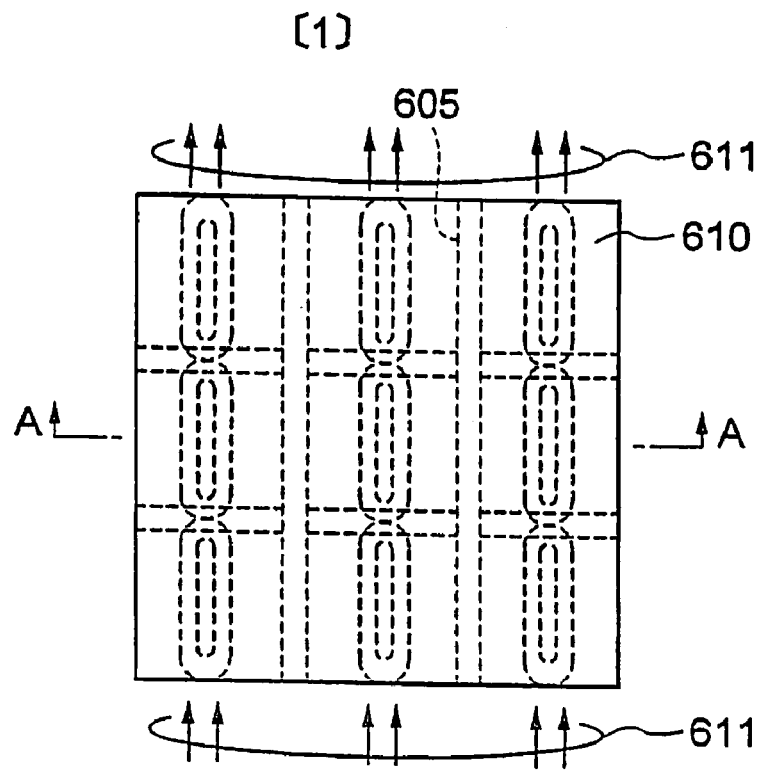
FIG. 23 is a pair of schematic views illustrating Example 4 of the present invention (the sixth part), in which a plan view thereof is shown in FIG. 23(1) and a vertical sectional view taken on line A-A of FIG. 23(1), in FIG. 23(2).
Figure 23:
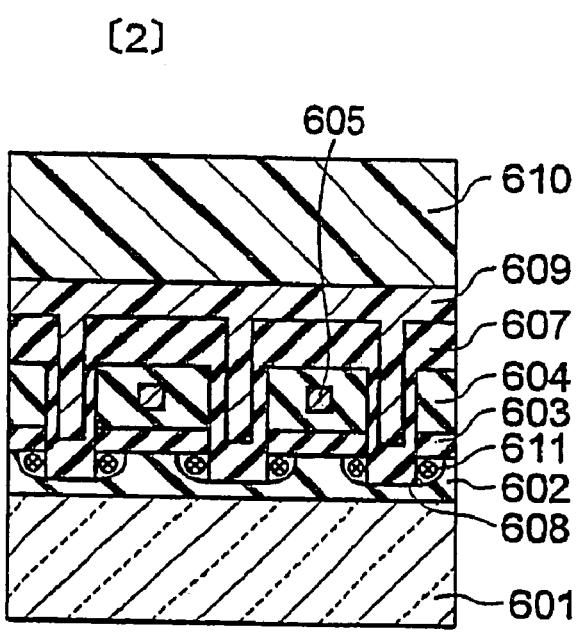
Figure 24:
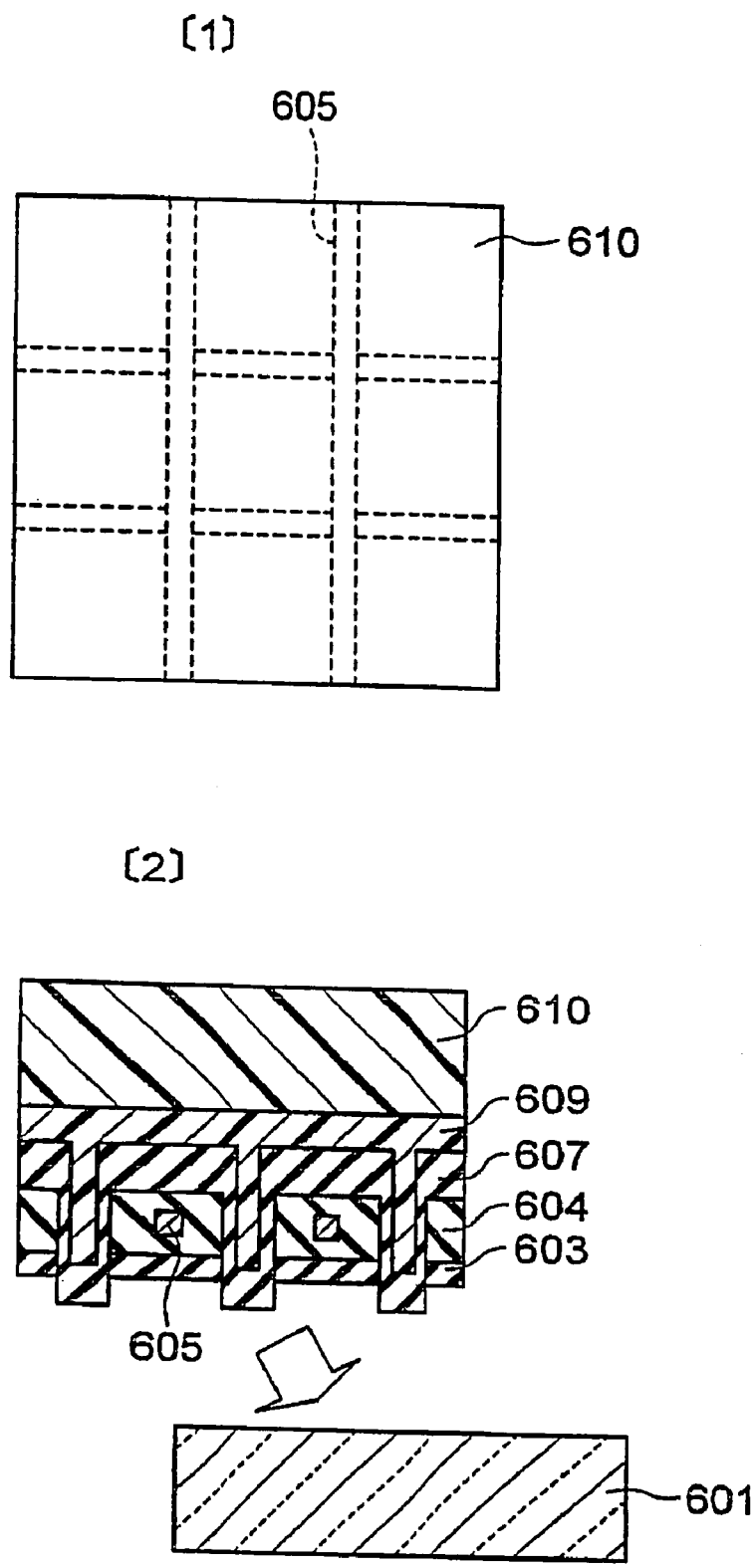
FIG. 24 is a pair of schematic views illustrating Example 4 of the present invention (the seventh part), in which a plan view thereof is shown in FIG. 24(1) and a vertical sectional view taken on line A-A of FIG. 24(1), in FIG. 24(2).
Figure 25:
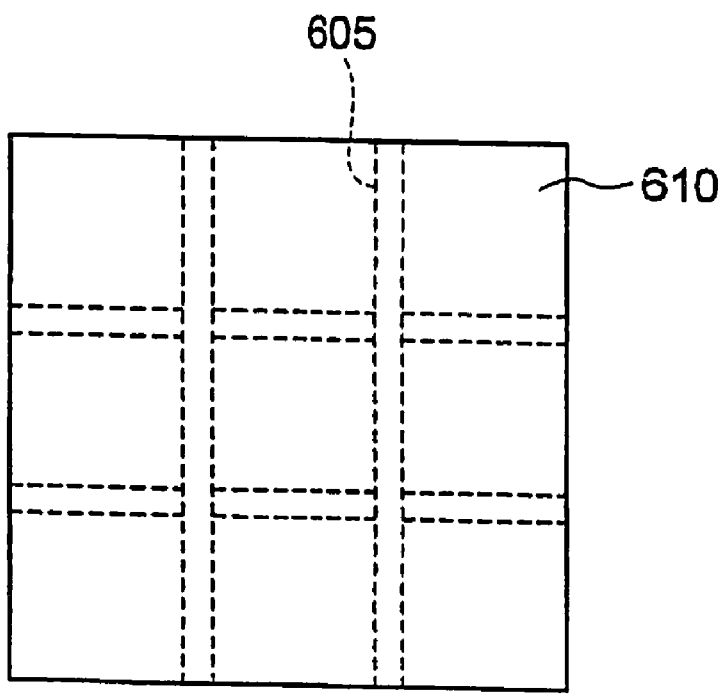
FIG. 25 is a pair of schematic views illustrating Example 4 of the present invention (the eighth part), in which a plan view thereof is shown in FIG. 25(1) and a vertical sectional view taken on line A-A of FIG. 25(1), in FIG. 25(2).
Figure 25:
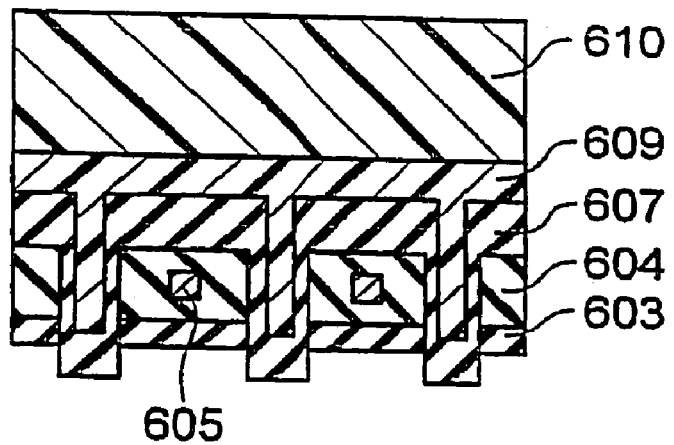

Next, as shown in FIG. 23, a layered structure between the glass substrate 601 and the plastic substrate 610 is immersed into hydrofluoric acid 611. As the gap spaces 608 have been set through the whole silicon oxide film 602 even under the region where the interconnections 605 are present, the hydrofluoric acid 611 permeates through the gap spaces 608 into the whole silicon oxide film 602. Therefore, as shown in FIG. 24, the glass substrate 601 can be peeled off by way of the silicon oxide film 603. Now, as shown in FIG. 25, the transfer of the TFTs and the interconnections 605 is completed.

FIFTH EXAMPLE

Figure 26:
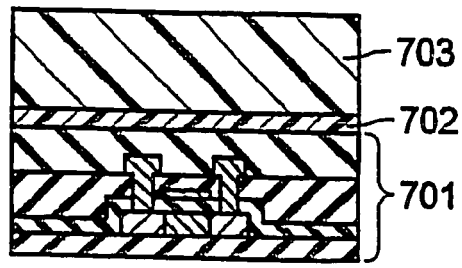
FIG. 26 is a series of schematic cross-sectional views illustrating Example 5 of the present invention and the steps of a manufacturing method thereof proceed in the order of FIG. 26(1) to FIG. 26(4).
Figure 26:
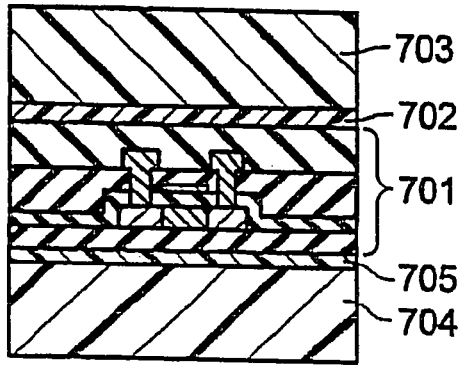
Figure 26:
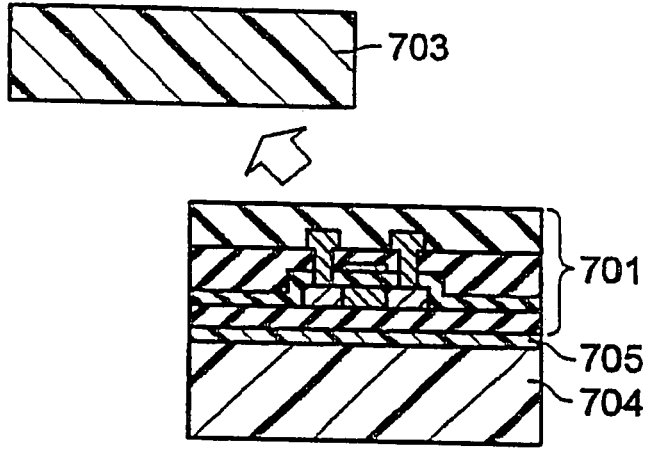
Figure 26:
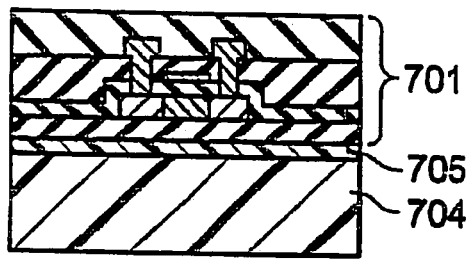

The terminal connection method (the method of bringing out a terminal) for the TFT substrate in Examples 1-4 is described below. Firstly, as shown in FIG. 26(1), by the method described in Examples 1-4, a primary transfer substrate 703 is adhered to the top of the TFT 701 by way of the adhesion layer 702. Hereat, for the adhesion layer 702, a water-soluble material is employed. Next, as shown in FIG.

26(2), a plastic substrate is adhered, as a secondary transfer substrate 704, to the back of the TFT 701 by way of the adhesion layer 705, which is water insoluble. Next, as shown in FIG. 26(3), by dissolving the adhesion layer 702 with water, the primary transfer substrate 703 is peeled off. After that, in the state shown in FIG. 26(4), the terminal can be brought out by the step of performing photolithography, etching and such.

There can be used another method wherein the adhesion layer 702 for the primary transfer substrate 703 and the adhesion layer 705 for the secondary transfer substrate 704 are each formed of materials with different melt temperatures in such a way that by conducting a heat treatment, only the primary transfer substrate 703 is peeled off. With respect to the primary transfer substrate 703 and the secondary transfer substrate 704, it is not necessary to be a plastic substrate, and a glass substrate, a metal substrate or a layered substrate of two or more of these layers can be utilized. The thermal conductivity of the transfer substrates are preferably set about the same as or greater than that of silicon oxide.

SIXTH EXAMPLE

Figure 27:
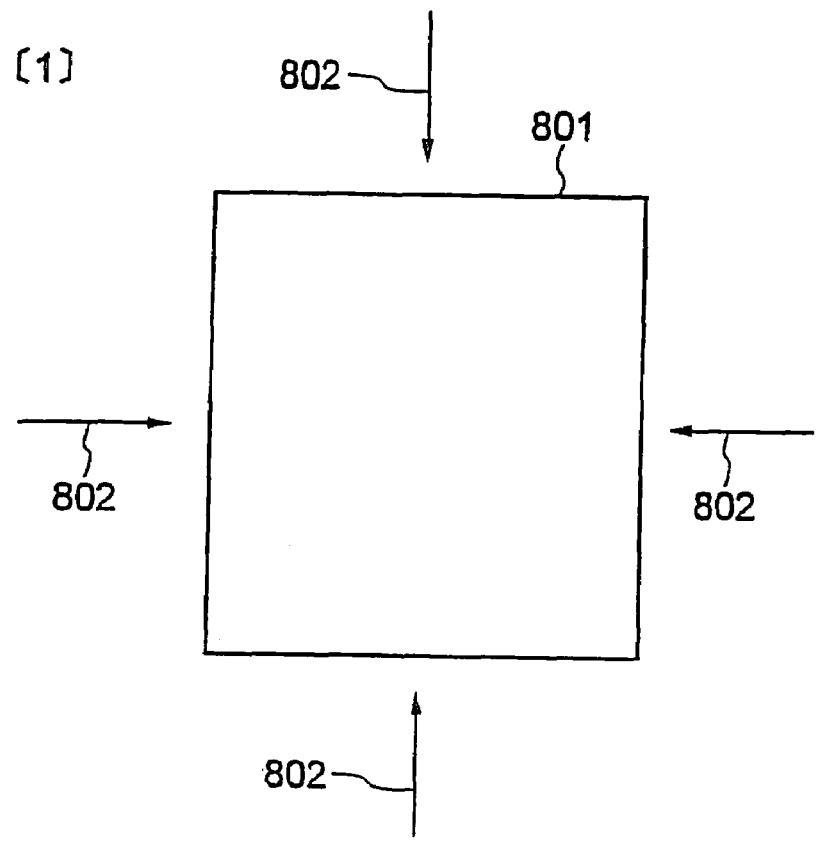
FIG. 27 is a series of schematic plan views illustrating Example 6 of the present invention and the steps of a manufacturing method thereof proceed in the order of FIG. 27(1) to FIG. 27(2).
Figure 27:
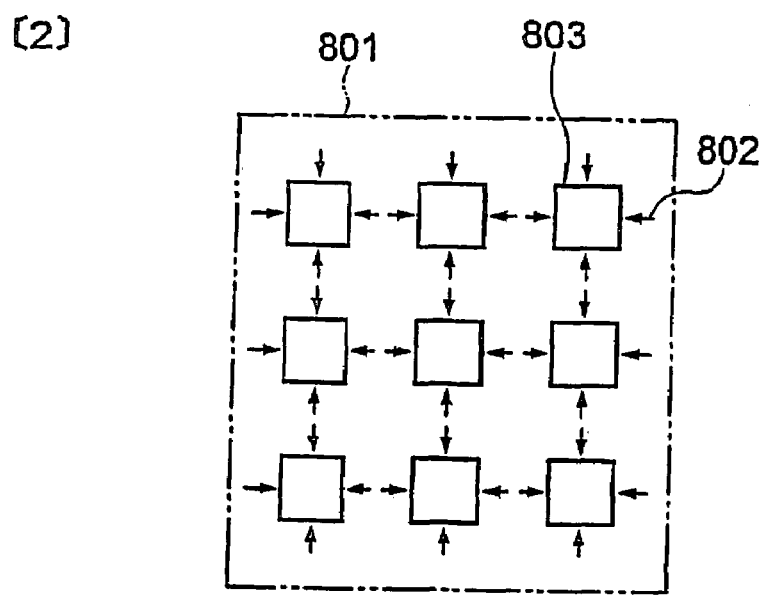

In Examples 1-4, as shown in FIG. 27(1), the greater the area of the layered structure 801 between the glass substrate and the plastic substrate is, the longer the time period for the etchant 802 to penetrate deep into the structure with gap spaces becomes. Accordingly, after the plastic substrate is bonded thereto, the layered structure 801 is cut into sections of prescribed size, making numerous small layered structures 803, as shown in FIG. 27(2). This shortens the distance for the etchant 802 to penetrate into in the step of peeling off a substrate, and thus, the step can be completed in a shorter period of the time.

The invention claimed is:

1. A method of manufacturing a thin film device substrate, comprising, in order, the steps of:
    forming on a first substrate, a peeling-off film made of a porous film;
    forming a semiconductor film on said peeling-off film;
    forming a thin film transistor with said semiconductor film as an active layer thereof;
    bonding a second substrate onto said thin film device; and
    peeling off said first substrate at said peeling-off film by driving a wedge into said peeling-off film to break said porous film mechanically.

2. A method of manufacturing a thin film device substrate, comprising the steps of:
    forming on a first substrate, a peeling-off film made of a porous film;
    forming a semiconductor film on said peeling-off film;
    bonding a second substrate onto said semiconductor film;
    peeling off said first substrate at said peeling-off film by driving a wedge into said peeling-off film to break said porous film mechanically; and
    forming a thin film transistor with said semiconductor film as an active layer thereof after peeling off said first substrate at said peeling-off film.

* * * * *

UNITED STATES PATENT AND TRADEMARK OFFICE
CERTIFICATE OF CORRECTION

PATENT NO.       : 7,579,222 B2
APPLICATION NO. : 11/503286
DATED            : August 25, 2009
INVENTOR(S)      : Nakata et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 230 days.

Signed and Sealed this

Fourteenth Day of September, 2010

David J. Kappos
*Director of the United States Patent and Trademark Office*